(12) United States Patent
Parkinson

(10) Patent No.: US 8,792,270 B2
(45) Date of Patent: Jul. 29, 2014

(54) PROGRAMMABLE RESISTANCE MEMORY

(75) Inventor: Ward Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 245 days.

(21) Appl. No.: 13/104,062

(22) Filed: May 10, 2011

(65) Prior Publication Data
US 2011/0211391 A1 Sep. 1, 2011

Related U.S. Application Data

(63) Continuation-in-part of application No. 12/381,259, filed on Mar. 10, 2009, now Pat. No. 7,957,207.

(51) Int. Cl.
G11C 11/21 (2006.01)

(52) U.S. Cl.
USPC .......................... 365/163; 365/148

(58) Field of Classification Search
USPC .......................... 365/163 O, 148 X, 163, 148
See application file for complete search history.

(56) References Cited

U.S. PATENT DOCUMENTS 7,154,774 B2 * 12/2006 Bedeschi et al. ............. 365/163
7,280,390 B2 * 10/2007 Kostylev et al. ............. 365/163
7,388,775 B2 *  6/2008 Bedeschi et al. ............. 365/163

* cited by examiner

Primary Examiner — Vanthu Nguyen
(74) Attorney, Agent, or Firm — Kevin L. Bray

(57) ABSTRACT

A memory includes an interface through which it provides access to memory cells, such as phase change memory cells. Such access permits circuitry located on a separate integrated circuit to provide access signals, including read and write signals suitable for binary or multi-level accesses.

25 Claims, 11 Drawing Sheets

PROGRAMMABLE RESISTANCE MEMORY

CROSS-REFERENCE TO RELATED APPLICATIONS

This application is a continuation-in-part of U.S. patent application Ser. No. 12/381,259, filed Mar. 10, 2009 now U.S. Pat. No. 7,957,207, the disclosure of which is incorporated by reference herein.

FIELD OF INVENTION

This invention relates to electronic memory devices.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are programmable resistance technologies, such as phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In some chalcogenide materials, the resistivity varies by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent that the crystalline state.

A chalcogenide memory device may utilize the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. A chalcogenide memory device's range of resistance values is generally bounded by a set state and a reset state of the chalcogenide material. By convention, the set state is a low resistance structural state whose electrical properties are primarily controlled by the crystalline state of the chalcogenide material and the reset state is a high resistance structural state whose electrical properties are primarily controlled by the amorphous state of the chalcogenide material.

Phase change may be induced by increasing the temperature locally. Below 150° C., both of the phases are reasonably stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C. for GST 225, for example) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance of the material. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovano et al.; and "Morphing Memory," published in *Science News*, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or crosslinking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as $N_2$ or $O_2$; forming a chalcogenide nitride or oxide, for example, and the chalcogenide may be modified by an ion implantation or other process. Materials may also be deposited using chemical vapor deposition (CVD) processes, for example.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at fast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Notwithstanding the desirable attributes of phase change memories, a phase change memory that can precisely distinguish among different memory states, particularly a memory that employs multi-level programming, would be highly desirable.

SUMMARY OF THE INVENTION

A memory in accordance with the principles of the present invention employs off-chip (that is, located in an external circuit) resources to assist in accurately writing to and reading from a memory array. In some embodiments, such a memory array is implemented as programmable resistance memory, and such a programmable resistance memory may be a phase change memory, for example.

In an illustrative embodiment a memory in accordance with the principles of the present invention includes an interface that sends memory-array signals off-chip for analysis. Such signals may be row or column signals that could be used by a separate integrated circuit to determine the contents of an accessed memory cell, for example. In such an embodiment, the signals may be conditioned, by buffering for example, before being sent off-chip. Such row and column signals may be taken directly from row and column lines within a memory array and, as such, would provide direct access to a selected memory cell for evaluation of such cell's content.

A memory in accordance with the principles of the present invention may also include an interface for accepting access signals from another integrated circuit, such as current-pulse or voltage-pulse signals employed by a phase change memory, for example. Such access signals may include READ signals or WRITE signals. The READ signals may be used in conjunction with a variety of READ methods and may be employed to determine the contents of memory cells programmed using binary or multilevel cell methods. Similarly, the WRITE signals may exhibit a variety of characteristics and may be of different amplitudes, durations, and rates of increasing or decreasing amplitude, and may be employed to write binary or multi-level (that is, three or more-level) data into cells within the memory array.

In various embodiments the memory's interface is configured to accept from another integrated circuit digital or analog signals for use in programming and to provide digital or analog signals to another integrated circuit for use in reading the contents of one or more cells within the memory's array. In other embodiments the interface may be configured to operate with error detection and correction circuitry positioned on another integrated circuit to enhance the accuracy of the storage, retention, and retrieval of data. A memory's interface may include circuitry that provides feedback to an external integrated circuit, such as a memory controller, that employs the feedback to adjust characteristics of an access signal provided to the memory by the memory controller.

In another aspect of the invention, a memory controller includes interface circuitry configured to operate in conjunction with an off-chip memory to provide access signals to the memory. The memory controller may include analog to digital and digital to analog converters, along with signal conditioning and shaping circuits configured to produce access signals employed by the memory. A memory controller in accordance with the principles of the present invention may also provide error detection and correction circuitry. Such a controller may also include a processor configured to divide the difference of voltage signals by the difference of current signals to yield a dynamic resistance value for an accessed memory cell.

A programmable resistance memory that employs an external circuit for precise analysis of one or more of its memory states in accordance with the principles of the present invention may be particularly suitable for operation in a variety of electronic devices, including cellular telephones, radio frequency identification devices (RFID), computers (portable and otherwise), solid state drives (SSDs), location devices (e.g., global positioning system (GPS) devices, particularly those that store and update location-specific information), and handheld electronic devices, including personal digital assistants (PDAs), and entertainment devices, such as MP3 players, for example.

The invention further provides a procedure for reading a programmable resistance memory. The procedure applies one or more fixed voltages between the address lines of the selected memory cell and measures the current resulting from each voltage. A measure of the resistance of the memory cell can be computed by dividing a particular applied voltage by the particular current resulting from the applied voltage. Alternatively, the resistance may be assessed by dividing the difference between two fixed voltages by the difference in current resulting from the two fixed voltages. The procedure includes identification of a voltage range for selecting the fixed voltages that is indexed to the voltage at which an isolation device that regulates access to the memory cell triggers on. The voltage range insures that the measured resistance reflects the resistance of the memory cell without interference from the resistance of the isolation device. The procedure also sets an upper limit on the applied voltage to prevent inadvertent programming of the selected memory cell.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Process descriptions may include flowcharts that illustrate various steps taken in a process. Such flowcharts and accompanying discussion are not meant to be an exhaustive explanation of every step and every procedure in such a process. Rather, they are meant to provide a description with sufficient detail to enable one of ordinary skill in the art to practice and use the invention. In some embodiments, additional steps may be employed or steps may be carried out in a different sequence than set forth in the flowchart and associated discussion. The term "voltage signal" or "voltage pulse signal" is used herein to refer to a signal that is voltage-compliant. That is, the voltage of the signal is regulated to a desired level. Similarly, the term "current signal" or "current pulse signal" is used herein to refer to a signal that is current-compliant; the current of the signal is regulated to a desired level. Accordingly, the scope of the invention is defined only by reference to the appended claims.

Figure 1:
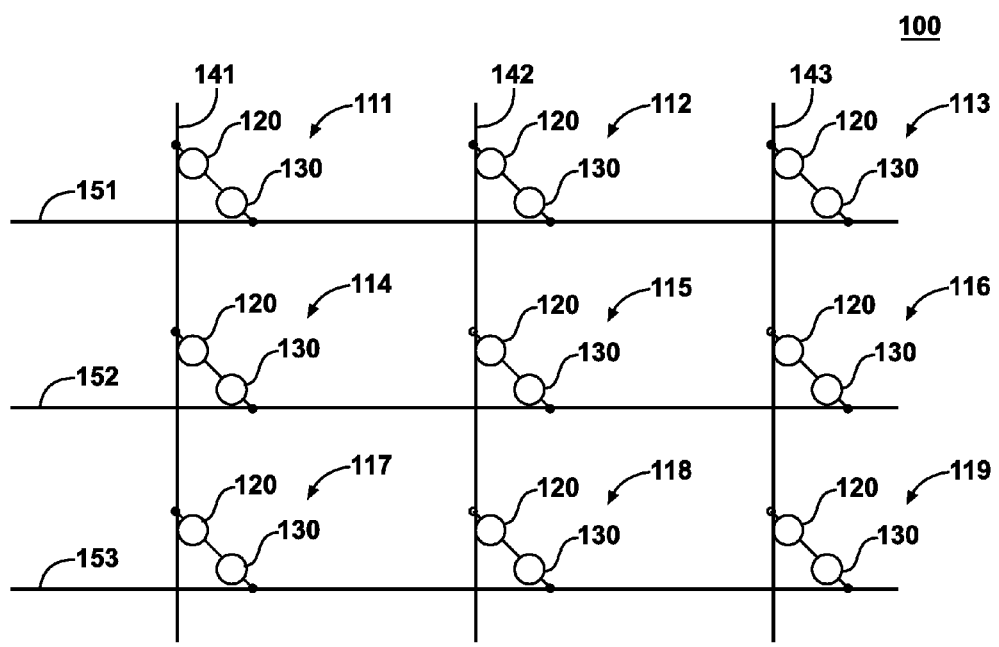
FIG. 1 is a block diagram of an array of memory cells, each including an isolation device and a programmable resistance memory element, in accordance with the principles of the present invention.

In the illustrative embodiment of FIG. 1, a memory array 100 in accordance with the principles of the present invention includes memory cells 111-119 arranged in a cross-point array. Each cell includes a memory element 130 and an isolation device 120. For convenience and clarity of illustration, only nine cells are shown, but billions may be included in an individual device. The isolation device 120 may be implemented as a transistor, diode, or as an Ovonic Threshold Switch (OTS), for example.

The memory array 100 includes column lines 141-143 and row lines 151-153, which are used to select a particular memory cell within the array during an access operation. An access operation may be a READ operation, or a WRITE operation, for example. In a binary memory configuration, each cell may be written to a "1" or a "0." In a multi-level configuration, each cell may be written to any of three or more memory states. Row lines 151-153 and column lines 141-143 may also be referred to herein, respectively, as word address and column address lines.

With memory elements 130 connected to word address lines and coupled through isolation devices 120 to bit address lines 141-143, a specific memory cell is accessed by assertion of the appropriate word and bit address lines. Asserting word address line 152 and bit address line 142, for example, selects memory cell 115 for access (that is, for a READ or WRITE operation).

In operation, the isolation device 120 may act as a switch that is either "off" or "on" depending on the voltage applied across the memory cell 111-119. The off state may be a substantially electrically nonconductive state and the on state may be a substantially electrically conductive state. The isolation device 120 may exhibit a threshold voltage beyond which the device becomes highly electrically conductive. With an applied potential less than the threshold voltage, the device is, effectively an open circuit, which thereby isolates the associated memory element 130. Such isolation is used to ensure that inadvertent accesses are not executed upon or through memory elements that are programmed to a low-resistance state and that are "partially-accessed." By "partially-accessed," we mean a memory element that shares a row or column access line with a memory element that is being accessed. With an applied voltage greater than the threshold voltage, the device 120 is, effectively, a short circuit with a series voltage drop of Vh (Vh=0.5V in this illustrative embodiment, less than the illustrative threshold voltage of 3.0V) With the device 120 in its highly conductive state, it thereby allows access to the associated memory element 130. With the isolation device 120 "thresholded," a portion of the voltage that was applied across the memory cell 115 will fall across the isolation device 120. The remainder of the applied voltage will fall across the memory element 130 and, when properly biased, that portion of the applied voltage will be sufficient to perform an access operation (e.g., READ or WRITE). The isolation device 120 may also be referred to as an access device, a select device, or a switch, for example.

Figure 2:
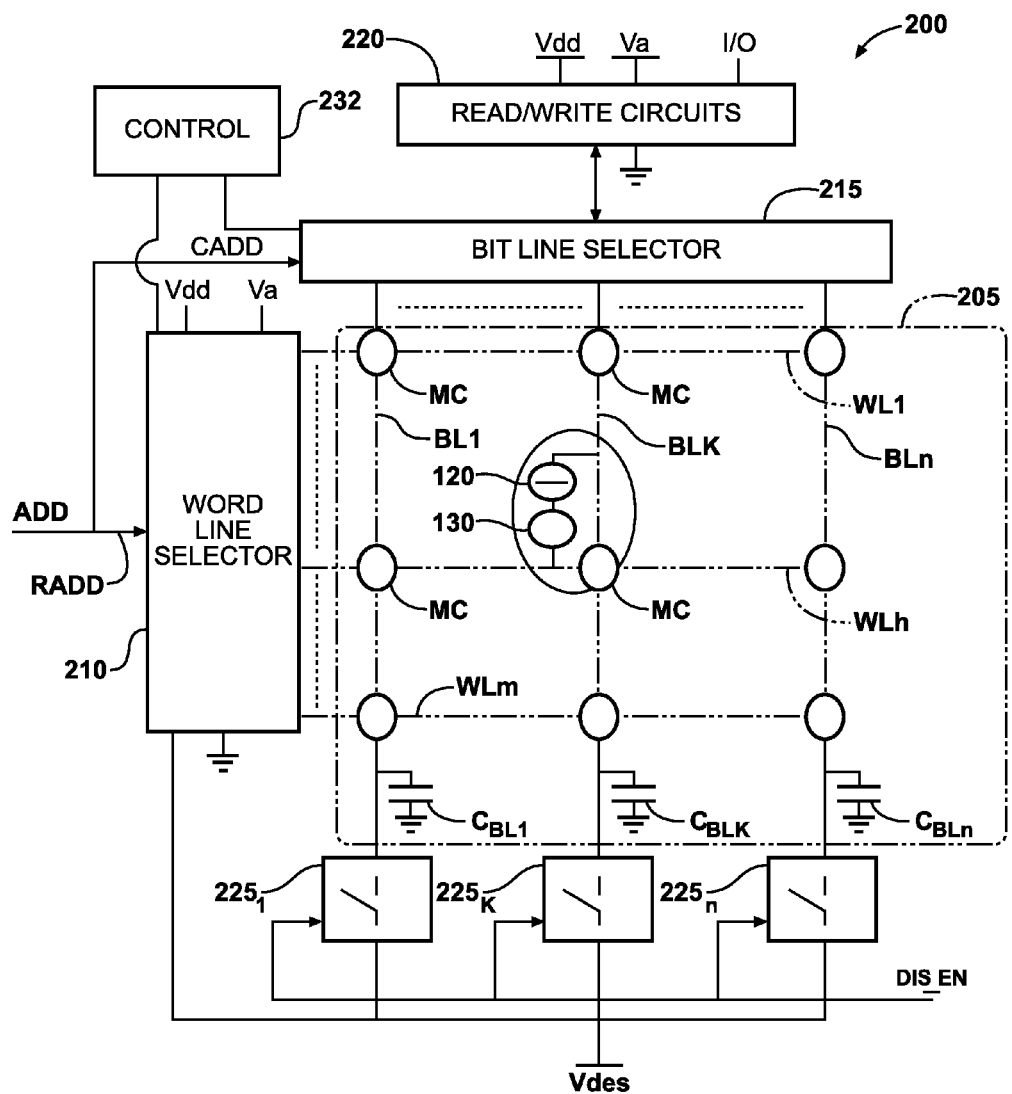
FIG. 2 is a block diagram of a memory array, including peripheral circuitry, in accordance with the principles of the present invention.

The block diagram of FIG. 2 illustrates a crosspoint array of memory cells such as those of FIG. 1, along with associated access circuitry. In this illustrative embodiment, the memory cells are labeled MC, the row/word lines are labeled WLn, and the column/bit lines are labeled Bln. As previously noted, the terms, "rows," "word lines," "bit lines," and "columns" are merely meant to be illustrative and are not limiting with respect to the type and style of the sensed array. The memory 200 includes a plurality of memory cells MC arranged in an array 205. The memory cells MC in the matrix 205 may be arranged in m rows and n columns with a word line WL1-WLm associated with each matrix row, and a bit line BL1-BLn associated with each matrix column.

The memory 200 may also include a number of auxiliary lines, including a supply voltage line Vdd and a ground (also referred to as reference) voltage line, respectively distributing a supply voltage Vdd and return throughout the memory 200. Depending on configurations and materials, the supply voltage Vdd may be, for example, in a range from 1V to 3V: 1.8V or 3V, for example. A high voltage supply line Va may provide a relatively high voltage, generated by devices (e.g. charge-pump voltage boosters not shown in the drawing) integrated on the same chip (that is, included on the same standalone device), or externally supplied to the memory device 200. For example, the high voltage Va may be 4.5-5 V (or 7-8V if a higher programming current is used) and such a voltage may be employed, for example to provide a relatively high write current to a selected memory cell.

Each memory cell MC includes a memory element 130 that employs a programmable resistance memory material, such as phase change memory material, and an isolation device 120, as described in the discussion related to FIG. 1. Each memory cell MC in the matrix 205 is connected to a respective one of the word lines WL1-WLm and a respective one of the bit lines BL1-BLn. In particular, the storage element 130 may have a first terminal connected to the respective word line WL1-WLn and a second terminal connected to a first terminal of the associated access device 120. The access device 120 may have a second terminal connected to a bit line BL1-BLm. Alternatively, the storage element 130 may be connected to the respective bit line BL1-BLm and the access device 120, associated with the storage element 130, may be connected to the respective word line WL1-WLn.

A memory cell MC within the matrix 205 is accessed by selecting the corresponding row and column pair, i.e. by selecting the corresponding word line and bit line pair. Word line selector circuits 210 and bit line selector circuits 215 may perform the selection of the word lines and of the bit lines on the basis of a row address binary code RADD and a column address binary code CADD, respectively, part of a memory address binary code ADD, for example received by the memory device 200 from a device external to the memory (e.g., a microprocessor). The word line selector circuits 210 may decode the row address code RADD using, for example, CMOS decode circuits and select a corresponding one of the word lines WL1-WLm, identified by the specific row address code RADD received. The bit line selector circuits 215 may decode the column address code CADD and select a corresponding bit line or, more generally, a corresponding set of bit lines of the bit lines BL1-BLn. The set may correspond, for example, to selected bit lines that can be read during a burst reading operation on the memory device 200. A bit line BL1-BLn may be identified by the received specific column address code CADD.

The bit line selector circuits 215 interface with read/write circuits 220. The read/write circuits 220 enable the writing of desired logic values into the selected memory cells MC, and reading of the logic values currently stored therein. The read/write circuits 220 may include sense amplifiers, comparators, reference current/voltage generators, and current and/or voltage pulse generators for reading the logic values stored in the memory cells MC and current a/o voltage pulse generators for writing to the memory cells MC.

In an illustrative embodiment, when the memory device 200 is not being accessed (between reads and writes or during a standby period, for example), the word line selection circuits 210 may keep the word lines WL1-WLm at a relatively high de-selection voltage, Vdes (for example, a voltage roughly equal to half the high voltage Va (Va/2)). At the same time, the bit line selection circuits 215 may keep the bit lines BL1-BLn disconnected, and thus isolated, from the read/write circuits 220 or, alternatively, at the de-selection voltage Vdes. In this way, inadvertent accesses of the memory cells is prevented, since the bit lines BL1-BLn are floating or at a voltage close to that of the deselected word lines and, consequently, approximately zero voltage is dropped across the access elements 120. Additionally, spare (redundant) rows and columns may be provided and used with a selection means to replace defective rows, bits, and columns by techniques familiar to those skilled in the art.

Access methods such as may be employed by a programmable resistance memory in accordance with the principles of the present invention are described in greater detail in the discussion related to the following Figures. Such access methods may be used in combination with other, known, access methods disclosed, for example, in: U.S. Pat. No. 7,154,774 to Bedeschi et al; U.S. Pat. No. 7,280,390, to Kostylev et al; U.S. Pat. Appl. Pub. No. 2006/0056251 to Parkinson; U.S. Pat. No. 7,453,715 to Parkinson; U.S. Pat. Appl. Pub. No. 2006/0279979 to Lowrey et al, and U.S. Pat. No. 7,495,944 to Parkinson et al, the disclosures of which are hereby incorporated by reference.

During an access operation, the word line selection circuits 210 may lower the voltage of the selected one of the word lines WL1-WLm to a word line selection voltage $V_{WL}$ (for example, having a value equal to 0V, ground potential, and the remaining word lines may be kept at the word line de-selection voltage Vdes. Similarly, the bit line selection circuits 215 may couple a selected one of the bit lines BL1-BLn (more typically, a selected bit line set) to the read/write circuits 220, while the remaining, non-selected bit lines may be left floating or held at the de-selection voltage, Vdes. When the memory device 200 is accessed, the read/write circuits 220 force a suitable current a/o voltage pulse into each selected bit line BL1-BLn. The pulse amplitude, duration, and waveshape, including trailing edge rate, may depend, for example, on the operation to be performed and will be described in greater detail in the discussion related to the following Figures.

In order to avoid spurious reading of the memory cells MC, the bit line stray capacitances $C_{BL1}$-$C_{BLn}$ may be discharged before performing a read operation. To that end, bit line discharge circuits $225_{1-n}$ may be enabled in a bit line discharge phase of the memory device operation that may take place before or after an access operation, for example. The bit line discharge circuits $225_{1-n}$ may employ N-channel MOSFETs, for example, each having a drain terminal connected to the corresponding bit line BL1-BLn, a source terminal connected to a de-selection voltage supply line Vdes providing the de-selection voltage Vdes and a gate terminal controlled by a discharge enable signal DIS_EN.

In an illustrative embodiment, before starting an access operation, the discharge enable signal DIS_EN may be temporarily asserted to a sufficiently high positive voltage, so that all the discharge circuits $225_{1-n}$ turn on and connect the bit lines BL1-BLn to the de-selection voltage supply line Vdes. The discharge currents that flow through the discharge transistors cause the discharge of the bit line stray capacitances $C_{BL1}$-$C_{BLn}$ and thereby drive the bit lines to the de-selection voltage Vdes. Subsequently, before selecting the desired word line WL1-WLm, the discharge enable signal DIS_EN is de-asserted and the discharge circuits $225_{1-n}$ turned off. Similarly, the selected row and column lines may be respectively pre-charged to an appropriate safe starting voltage for selection and read or write operation.

Figure 3:
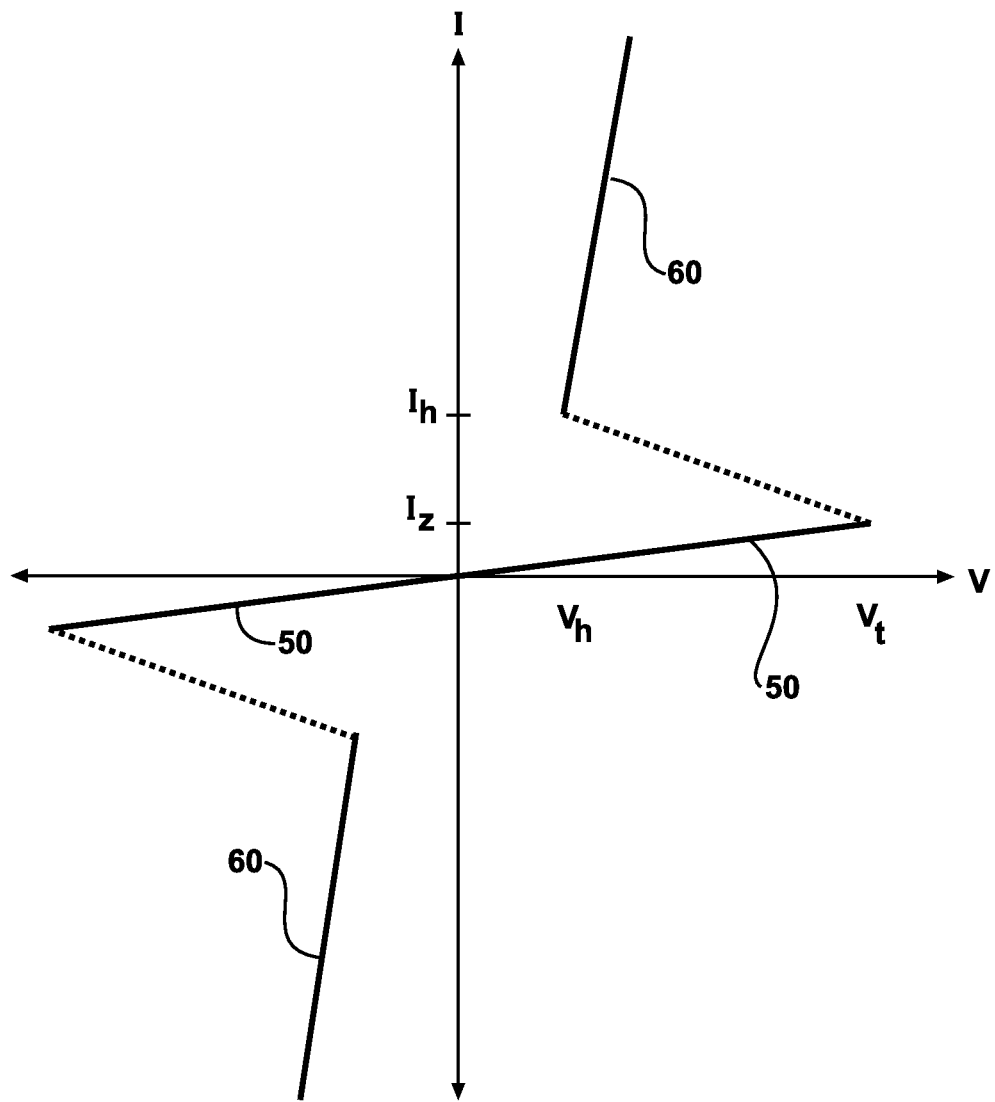
FIG. 3 is current/voltage plot of an isolation device, such as may be used in a memory array in accordance with the principles of the present invention.

FIG. 3 is a plot of voltage versus current for a chalcogenide threshold switching device such as may be employed by a memory in accordance with the principles of the present invention. The voltage/current (or, simply, V-I) characteristics apply generally to both OUM and OTS devices. The major distinction between an OUM device and an OTS device is that the phase of an OUM device may be modified, and remain so-modified after withdrawal of signal current, when supplied with a signal corresponding to the "on-state" branch 60 of the curve. The phase state of an OTS device is unmodified by passing more or less current through it; however (similar to the reset state of an OUM device), the impedance of the OTS device is reduced after a $V_t$ threshold voltage or threshold current $I_z$ is exceeded, lowering its dynamic resistance relative to the resistance before it is thresholded. The resistance of the OTS is determined by whichever branch "on-state" 60 or "off-state" 50 it happens to be operating on.

FIG. 3 shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative).

The I-V characteristic curve includes an "off-state" branch 50 and an "on-state" branch 60. The off-state branch 50 corresponds to the branch in which the current passing through the threshold switching material increases slightly upon increasing the voltage applied across the threshold material. This branch exhibits a small slope in the I-V plot and appears as a nearly horizontal line in the first (and third) quadrant of FIG. 3. The on-state branch 60 corresponds to the branch in which the current passing through the threshold material increases significantly upon increasing the voltage applied across the threshold material. The magnitude of the slope (dV/dI) of the on-state branch is greater than the magnitude of the slope of the off-state branch.

In the example shown in FIG. 3, the on-state branch exhibits a large slope in the I-V plot and appears as a substantially vertical line in the first (and third) quadrant. The slopes of the off-state and on-state branches shown in FIG. 3 are illustrative and not intended to be limiting. Regardless of the actual slopes, the on-state branch exhibits a steeper slope (lower dynamic resistance) than the off-state branch. When conditions are such that the current through the threshold material and voltage across material is described by a point on the off-state branch of the I-V curve 50, the threshold material is said to be in the "OFF" state. When conditions are such that the current through the threshold material and voltage across the threshold material is described by a point on the on-state branch 60 of the I-V curve, the threshold material is said to be in the "ON" state. The two states are distinguished by whether the threshold voltage $V_t$ has been exceeded in forcing current through the device.

The device (OUM or OTS) is in the "OFF" state, and no current flows through it when no voltage is applied across the device. This condition corresponds to the origin of the I-V plot shown in FIG. 3 (current=0, voltage=0). The threshold switching material remains in the OFF state, exhibiting a very-high impedance (on the order of 1 G.OMEGA., in some embodiments) as the voltage across the threshold switching material and the current through the threshold switching material is increased, up to a voltage $V_t$, referred to as the "threshold voltage" of the threshold switching material. When the voltage across the threshold switching material is less than $V_t$, the slope of the off-state branch of the I-V curve is small and the current flowing through the threshold switching material increases only in a small amount as the applied voltage is increased.

When the applied voltage across the threshold switching material equals or exceeds $V_t$, the threshold switching material switches from the off-state branch 50 to the on-state branch 60 of the I-V curve. The switching event occurs instantaneously and is represented by the dashed line in FIG. 3. Upon switching, the voltage across the threshold switching material decreases significantly and the current through the threshold switching material becomes much more sensitive to changes in the device voltage (hence, branch 60 is steeper than branch 50). The threshold switching material remains in the on-state branch 60 as long as a minimum current, referred to as a holding current $I_h$, is maintained through the device. Projecting the on-state branch 60 down to the abscissa yields a voltage, referred to as the holding voltage Vh—which can be viewed in series with the dynamic resistance of the "on" state.

If the signal supplied to the threshold device changes so that the current through the device falls below $I_h$, the threshold switching material normally returns to the off-state branch 50 of the I-V plot and requires re-application of a voltage of at least $V_t$ to resume operation on the on-state branch. If the current is only momentarily (a time less than the recovery time of the chalcogenide material) reduced below $I_h$, the ON state of the device (OUM or OTS) may be recovered upon restoring the current through the device to at least $I_h$.

Analogous switching behavior occurs in the third quadrant of the I-V plot shown in FIG. 3. Provided one is aware of the negative polarities of both the voltage and current of the I-V curve in the third quadrant, the switching behavior in the third quadrant is analogous to that described hereinabove for the first quadrant. For example, applied voltages having a magnitude greater than the magnitude of the negative threshold voltage in the third quadrant induces switching from the off-state branch 50 to the on-state branch 60.

While not wishing to be bound by theory, it is believed that application of a voltage across the threshold switching material which is at or above the threshold voltage may cause the formation of a conductive channel or filament within the threshold switching material. At the threshold voltage $V_t$, the electric field experienced by the chalcogenide material of a threshold switching device (OUM or OTS) is sufficiently high to induce a breakdown, or avalanche, effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide threshold switching material. The conductive filament extends through the chalcogenide threshold switching material and provides a low resistance pathway for electrical current. Portions of the chalcogenide material outside of the filament remain resistive. Since electric current traverses the path of least resistance, the presence of a conductive filament renders the chalcogenide material more conductive and establishes an "ON" state. In accordance with this proposed model, the creation of a conductive filament is the event that underlies the switching of the threshold switching material from its OFF state to its ON state. An OTS device switches from the ON state to the OFF state exhibiting the same characteristics it did before the switching event.

Figure 4:
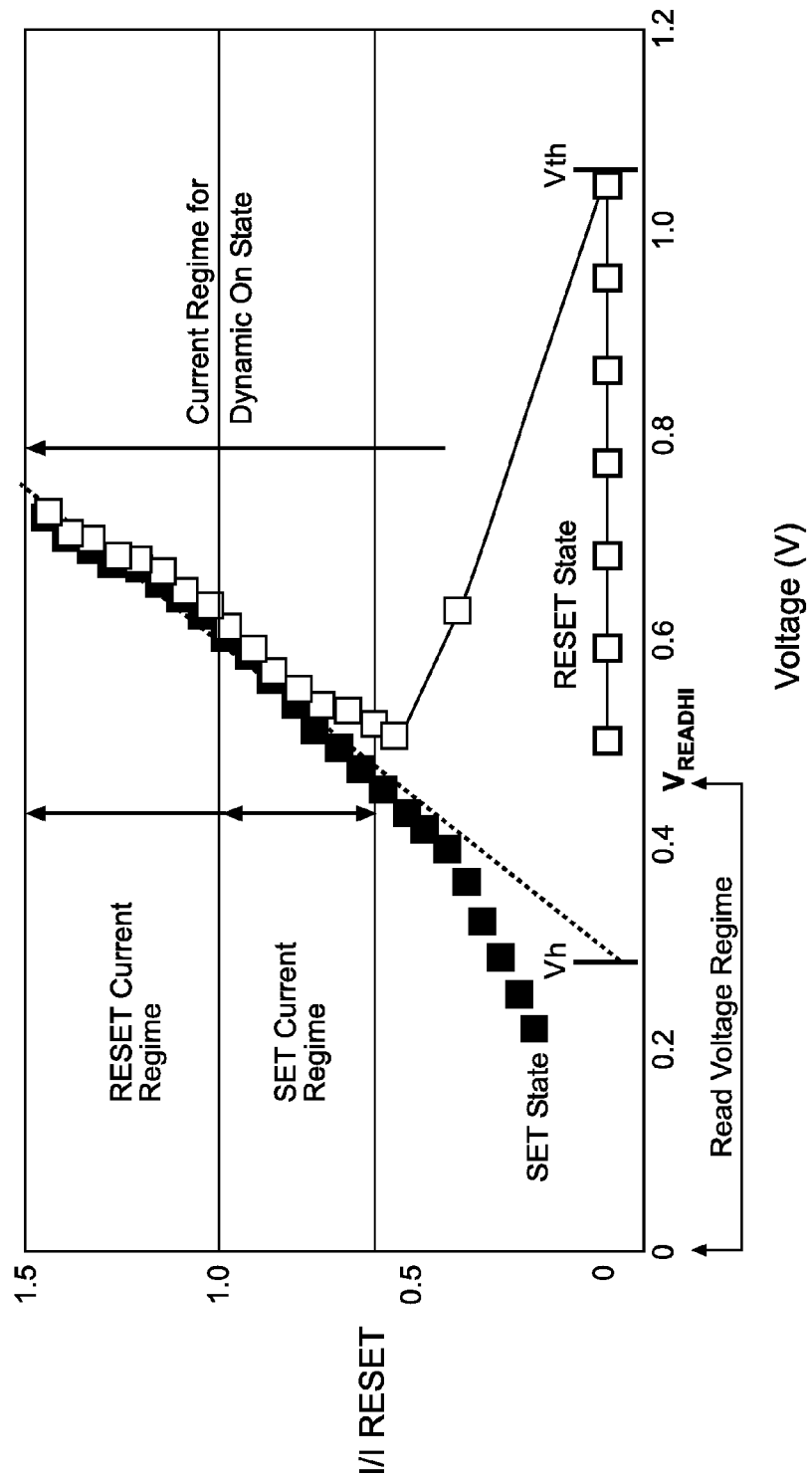
FIG. 4 is a current/voltage plot that illustrates various operating regimes employed by a programmable resistance memory in accordance with the principles of the present invention.

In contrast, as is known in the art and described in greater detail in the discussion related to FIG. 4, an OUM device may have characteristics, such as its resistance, modified while undergoing a switching event. The modification of such characteristics, which may be sensed by an electronic circuit, is the basis for non-volatile electronic memory devices.

The current versus voltage curve of FIG. 4 is a plot of $I/I_{RESET}$ versus voltage for an illustrative phase change device. In this illustrative embodiment the device is programmable to one of two resistance setting: a low resistance SET state and a high resistance RESET state. In order to program the device to the high-resistance RESET state a current having a magnitude of at least $I_{RESET}$ must be applied to the device and, consequently, the region above $I/I_{RESET}=1$ is labeled the RESET current regime. The current region within the "dynamic on" state regime that is below the RESET current level is referred to as the SET current regime and corresponds to an applied current/voltage level that would force a relatively lower resistance or SET OUM device. As previously described and as is indicated along the abscissa, in order to reach the "dynamic on" state, an applied signal must meet or exceed the device's threshold voltage "$V_t$" (assuming the device has previously been programmed to the RESET state).

On the other hand, if the device is in the SET state, it will exhibit very low resistance and will readily enter the "dynamic on" state with the application of a relatively lower voltage. That voltage $V_{READHI}$, the voltage at which a SET device is brought into the current regime for the "dynamic on" state, forms the upper bound of the device's read voltage regime. That is, because the resistance of a memory is unknown before being read and a device that is programmed to the SET state may be forced into the current regime for the "dynamic on" state with the application of a voltage greater than or equal to $V_{READHI}$, and may thereby alter the storage state of the memory device, READ voltages are kept below $V_{READHI}$ to avoid inadvertently disturbing the state of the memory (forcing a set bit to increase in resistance or a reset bit to decrease in resistance).

The timing diagrams of FIGS. 5A through 5D illustrate the process of accessing and operating (that is, reading, writing a logic "1", and writing a logic "0") a memory cell in accordance with the principles of the present invention. As described in the discussion related to FIG. 2, and as indicated in the timing diagrams of FIGS. 5A-5D, when not accessing an associated memory cell, row and column select signals are maintained at an intermediate voltage (V/2 in this illustrative embodiment) to further ensure against inadvertent accesses of cells within the array 200. That is, when no cells on a given row are to be selected, the respective row decoded output may be "OFF" and the corresponding row line $W_{1n}$ may be left at an intermediate value, such as V/2, by precharge circuitry, for example. Maintaining row and column lines at an intermediate voltage between accesses also limits the magnitude of voltage swings during operation, thereby allowing for faster, reduced-noise, lower-power operation. Such lower-power operation is particularly desirable in portable applications, allowing a device to operate for extended periods of time between recharging. Additionally, with rows and columns at equal voltages, the leakage between (unselected) rows and columns is reduced, further improving battery life.

In another illustrative embodiment, the unselected rows may be at V/3 (when writing 0) or 2V/3 (when reading or writing 1), thereby yielding an improvement in margin against inadvertently over-writing the contents of a memory element. However, this increases the voltage across deselected cells, which increases leakage.

Figure 5A:
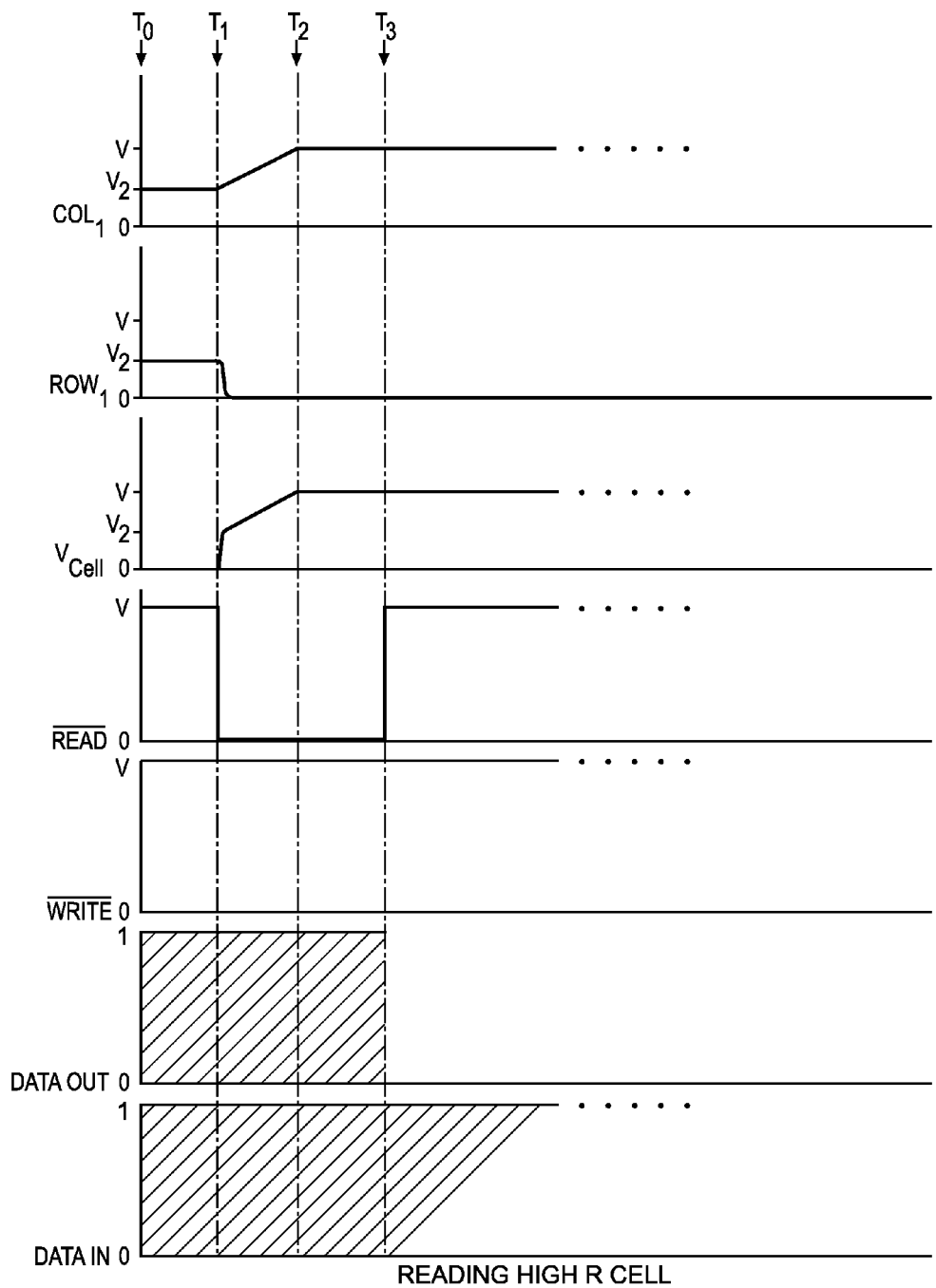
FIGS. 5A through 5E are timing diagrams that illustrate the operation of memory cells in accordance with the principles of the present invention.

The timing diagram of FIG. 5A depicts a read operation in accordance with the principles of the present invention in which a phase change memory cell being read is in a high-resistance, logic "0," RESET state. At time T0 both the row and column select signal, referred to here as ROW1 and COL1, respectively, are, as all row and column signals within the array 200 are, at the "precharge" voltage V/2.

In this illustrative example, the read process is initiated by driving the column line COL1 associated with the memory cell CELL 1,1 high and the row line ROW1 associated with the memory cell CELL 1,1 low (for example, to 0V) at time T1. Alternatively, the row and column lines may be activated (that is, driven low and high, respectively) separately, with, for example, the ROW1 line driven low before the column line COL1 is driven high. The column select signal COL1 may be implemented as a current pulse that is gated to a column line and thereby distributed to the column inputs of all memory cells in column 1 of the array 200. The row select signal ROW1 may be implemented by address decoding inputs that generated row control signals and thereby pull the "bottom" contacts of all the isolation devices (e.g., OTS devices) of a selected row to the circuit ground, for example.

At time T1, then, the row line ROW1 is driven low, (to 0V in this illustrative embodiment). This could be accomplished, for example, by driving the gate of an n-channel FET with the decoded row line signal. At the same time, the column line COL1 is charged by a current pulse that is generated by gating a READ current to a column selected by decoding column address lines. By READ current, we mean a current that is less than a current associated with the regime for the "dynamic on" state described in the discussion related to FIG. 4. A selected column line may be charged by a current source that is modulated, for example, by modulating the gate voltage of a p-channel FET and, as a result, the column lines may be charged more gradually than the row lines are discharged; such a charging scenario is depicted by the gradual upward and sharp downward curves, respectively, of FIG. 5A. Current supplied for a READ operation may be limited to something less than that associated with the "dynamic on" state by limiting the size of a p-channel FET that gates a READ current source to a selected column or by limiting the control voltage applied to the gate of a p-channel FET that performs the gating operation to assure the voltage across the OUM is less than Vt(oum). Such current-limiting ensures that no cell inadvertently receives enough current to disturb its state (if in the set state) or is thresholded (if in the reset state). As will be apparent to those skilled in the art, the read or write current source may feature a voltage compliance that limits the range of voltages applied to an accessed OUM and such current sources may be replaced by voltage sources featuring a current compliance that similarly ensures that no inadvertent over-writing of cells occurs.

The voltage Vcell across the memory cell CELL 1,1, the voltage sensed for a READ operation, is the difference between the column and row voltages. If, as in this example, the memory element is in a high resistance state, the voltage applied to the memory cell Vcell through the combination of "grounding" the row line ROW1 and the current-limited charging of the column line COL1 will be distributed across the series-connected OTS 130 and OUM 120. To a first approximation, the distribution of the voltage will be proportional to the resistances of the OTS 130 and the OUM 120. If their resistances are equal, the voltage will be distributed equally; if, for example, one of the devices (OTS or memory element) exhibits one third the total series resistance, one third of the voltage will fall across it, etc. In this illustrative embodiment, with the memory in a high resistance state, the proportion of the peak read voltage (reached at time T2) that falls across the OTS is not enough to trigger the OTS. In accordance with the principles of the present invention, parameters such as the peak READ voltage, relative resistances of the memory element and OTS, and OTS threshold voltage are selected so that the OTS is triggered at T2 during a READ operation only if the cell is in its low resistance state but the OTS is not triggered on during a READ operation if the cell is in its high resistance state. That is, the read voltage source applies a voltage across the memory cell that is greater than or equal to the threshold voltage of the OTS but that is less than the threshold voltage of the OTS+the threshold of the OUM. Alternative read schemes, such as those that detect a shift in the rate of cell voltage charging upon triggering of an isolation device such as an OTS are known and disclosed, for example, in the issued patents and published applications previously incorporated by reference herein.

In this illustrative embodiment the READ output is latched at time T3. A delay between T2 and T3 provides time for the output sense amplifiers to be accessed and for the voltage at a selected cell's column to settle. At time T2, the current driving up the selected Bit line may be discontinued so that the bit line does not charge to an excessive Read voltage. For example, if the memory element is in a low resistance state, the OTS has time to trigger and pull the column line down to a lower level, as in FIG. 5B, that will be recognized as a low resistance state (i.e., a "SET" or logic "1" state). In this illustrative embodiment, the positive-going edge of the READ signal may be used to latch data that is valid at time T3. As illustrated by the trace labeled DATA OUT, output data is undefined until T3, at which point DATA OUT becomes valid (logic "0" in this illustrative embodiment) and the rising edge of the READ signal latches the valid output. In this illustrative embodiment DATA IN is undefined and unused. DATA IN may be on the same signal line or a line separate from DATA OUT, using techniques familiar to those reasonably skilled at the art.

Figure 5B:
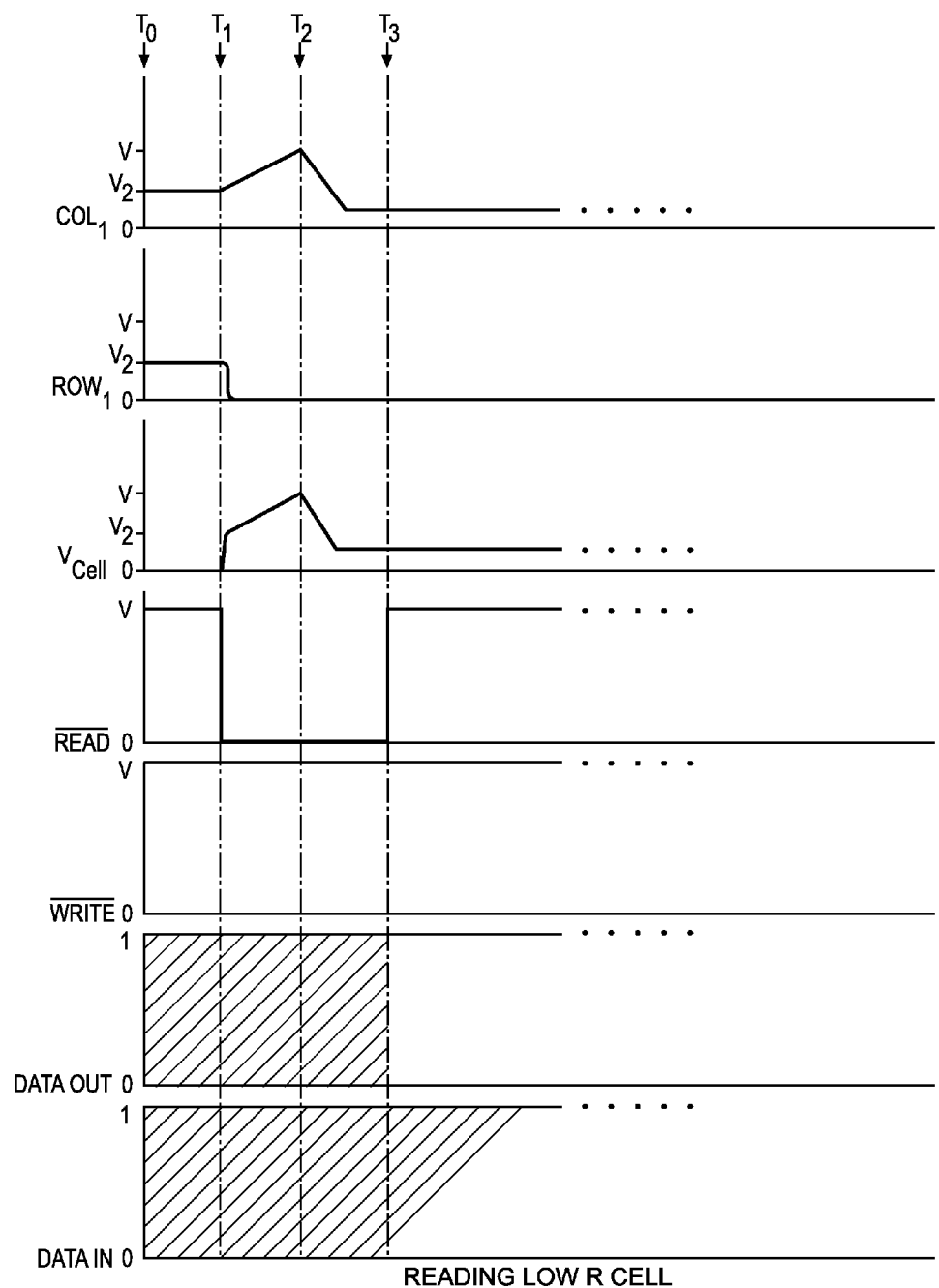

The timing diagram of FIG. 5B depicts a read operation in accordance with the principles of the present invention in which the memory cell being read (CELL 1,1) is in a low-resistance, logic "1," SET state.

At time T0 both the row one select signal ROW1 and column one select signal COL1 are, as all row and column signals within the array 200 are, at the "pre-charge," or "deselected," voltage, V/2. As described in greater detail above, at time T1 the row line ROW1 is driven to 0V and the column line COL1 is charged by a current pulse that may be generated by turning on a p-channel FET to gate the READ current source onto the selected column line, COL1, for example. As previously noted, the gate voltage applied to the p-channel FET may be modulated to limit the current supplied to the selected column line COL1, thereby ensuring that the memory state of an accessed cell is not inadvertently overwritten. In an illustrative embodiment a READ current pulse is turned off after adequate signal develops to reliably read the memory, thereby preventing excessive voltage building up across, or excessive current flowing through, the memory cell.

The voltage Vcell across the memory cell CELL 1,1 is the difference between the column and row voltages. The voltage applied to the memory cell Vcell through, for example, the combination of "grounding" the row line ROW1 and the current-limited charging of the column line COL1 will be distributed across the series-connected OTS 130 and OUM 120. The distribution of the voltage is proportional to the resistances of the OTS 130 and the OUM 120. In this illustrative embodiment, the OUM 120 exhibits a low resistance and the majority of the voltage Vcell falls across the OTS 130. At time T2, the voltage across the OTS 130 reaches the threshold voltage of the OTS 130 and the OTS triggers (that is, enters a low resistance state) in response. Because both the OTS 130 and OUM 120 are now in a low resistance state, the voltage Vcell across the memory cell falls, as indicated in the Vcell trace of FIG. 5B.

In this illustrative embodiment, the on resistance of the p-channel FET supplying current to the column line COL1 is greater than the on resistance of the n-channel FET discharging the row line ROW1 and, consequently, the column line voltage COL1 falls, while the row line voltage remains substantially at 0V. The voltage across the memory cell Vcell falls, approximately, to the sum of the OTS holding voltage (Vh), about 1V in this illustrative embodiment, and the product of the memory cell's resistance and current through it, as indicated by the trace labeled Vcell in FIG. 5B. This voltage may be sensed at time T3 and properly interpreted as a low resistance, "SET", "1" state. As previously described, design parameters may be adjusted so that the OTS triggers when the memory element is in a low resistance state but does not trigger when the memory element is in a high resistance state. At time T3, the read output is latched, as described in greater detail in the discussion above related to FIG. 5A.

Generally, when an OTS device is triggered during an access operation (whether a READ or a WRITE), the "snapback voltage," the difference between the OTS' threshold voltage and the OTS' holding voltage, is immediately impressed across the OUM. If the OUM is programmed to a low-resistance state, the snapback voltage could be great enough to take the OUM into the "dynamic on" current region. In order to prevent such an occurrence, the OTS snapback voltage may be reduced or the OUM $V_t$ increased, while maintaining a desired OTS threshold voltage $V_t$ (desired, that is, to properly bias access of the OUM). One may reduce the snapback voltage associated with an OTS, while maintaining a target OTS threshold voltage $V_t$, by using a plurality of thinner OTS devices in series. Other approaches to the adjustment of threshold and snapback voltages are known, and discussed, for example, in U.S. Pat. No. 7,280,390, which is hereby incorporated by reference.

Figure 5C:
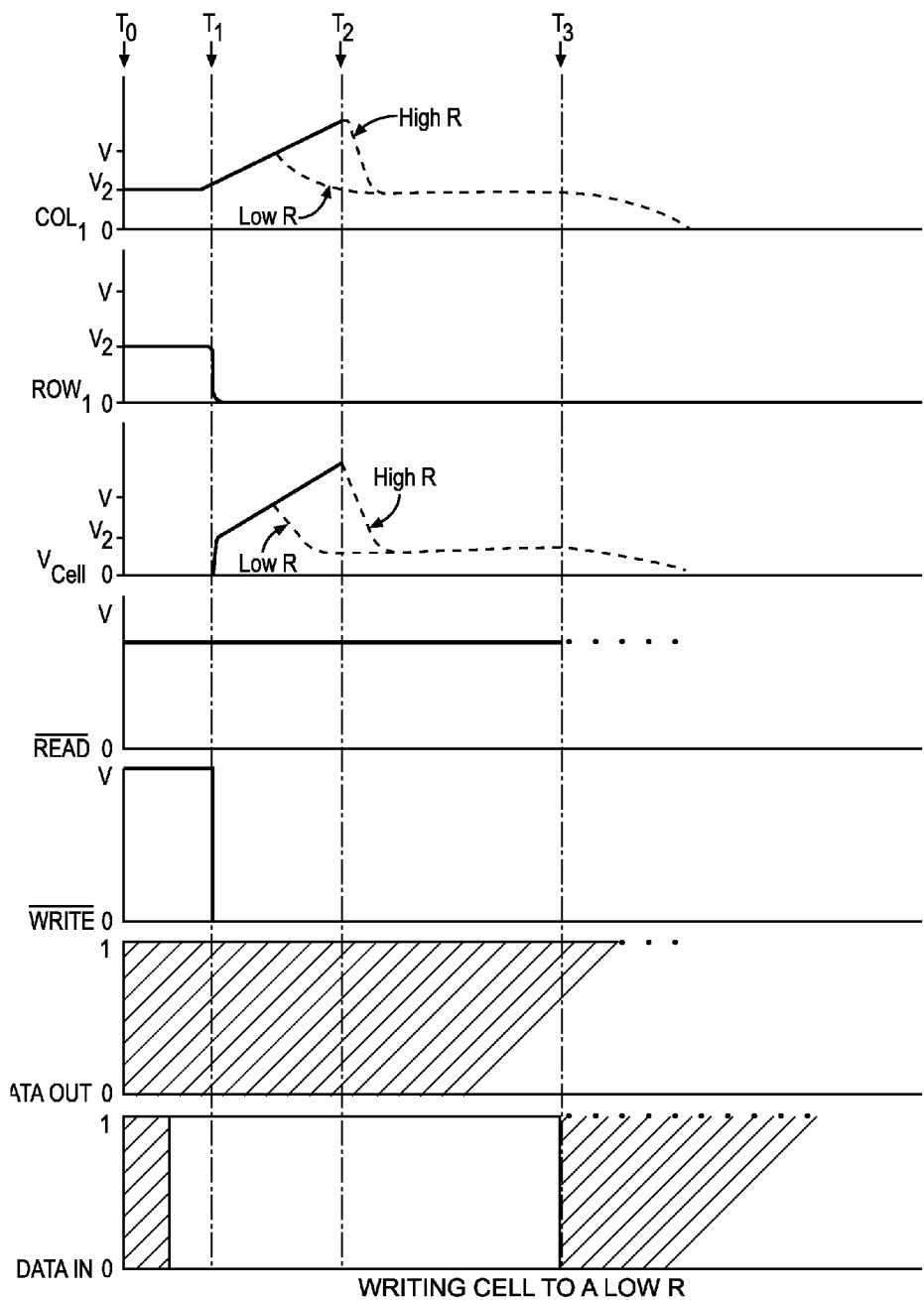

The timing diagram of FIG. 5C depicts the sequence of a write "1," SET, operation in accordance with the principles of the present invention. In this illustrative embodiment, programming a memory cell to a low resistance state (that is, writing a logic "1" into the memory), is accomplished by forcing a current through the memory cell that is of sufficient amplitude and duration to substantially crystallize an active volume fraction of the OUM memory element. As previously described, the pulse generation circuitry used to program a cell to a low resistance state will typically employ enough current to take the OUM into the "dynamic on" current range described in the discussion related to FIG. 4: typically, more current than employed in a READ operation, but less than employed in a RESET, write 0, operation. Or in the alternative, the same current (or less current) than that for RESET may be employed, but the bit is then RESET with a fast trailing edge rate (e.g. less than 10 nsec) or SET with a slow trailing edge rate (e.g. greater than 200 nsec).

In operation, at time T0 both the row one select signal ROW1 and column one select signal COL1 are at the "precharge," or deselect, voltage V/2. In an alternative embodiment, a V/3 deselect voltage may be employed to improve write margin. In this illustrative example, the WRITE1 process (also referred to herein as a SET process) is initiated at time T1 by driving the column line COL1 associated with the memory cell CELL 1,1 high (towards V+) and driving the row line ROW1 associated with the memory cell CELL 1,1 low (to 0V). In this illustrative embodiment the column line COL1 is charged to a positive voltage by a current pulse generated by asserting the WRITE1 signal at time T1.

As indicated in the trace labeled COL1, the column line of the selected memory cell CELL 1,1 begins to charge to a more positive voltage than V/2. At the same time, the row line, represented by the trace labeled ROW1 is rapidly discharged from V/2 to 0V. The memory cell voltage represented by the trace labeled Vcell is the difference between the column and row voltages.

If the OUM 120 is already in a low resistance state, the majority of the cell voltage Vcell will fall across the OTS 130. As a result, the OTS will trigger at a relatively lower cell voltage, as indicated by the broken-line traces labeled Low R in the COL1 and Vcell plots. If, on the other hand, the OUM 120 is in a high resistance state, the cell voltage Vcell will be distributed across the series combination of the OTS 130 and OUM 120 according to their relative resistances and the OTS 130 will trigger at a higher cell voltage, as indicated by the broken-line traces labeled High R in the COL1 and Vcell traces. In both cases, that is, where the OUM is SET or RESET, the OTS 130 and OUM 120 (if RESET) is triggered and sufficient current is delivered to the OUM 120 to program it to the logic "1," low resistance, state after the OTS triggers.

Various programming methods may be employed by a memory in accordance with the principles of the present invention. For example, the current source used to access the OUM may be limited to a value that is less than the current required to RESET the memory and may be applied for an extended period of time. In such an embodiment, the current is applied in a manner that raises the temperature of the phase change material within the OUM above the material's crystallization temperature, without raising the material to its melting temperature. On the other hand, using a method known in the art as a "SET SWEEP," a relatively high current may be applied to raise the material to its melting temperature, then, with the current gradually diminished, the temperature of the material is allowed to slowly fall through its crystallization temperature range, allowing the material to crystallize. Other programming methods known in the art may be employed by a memory in accordance with the principles of the present invention.

Figure 5D:
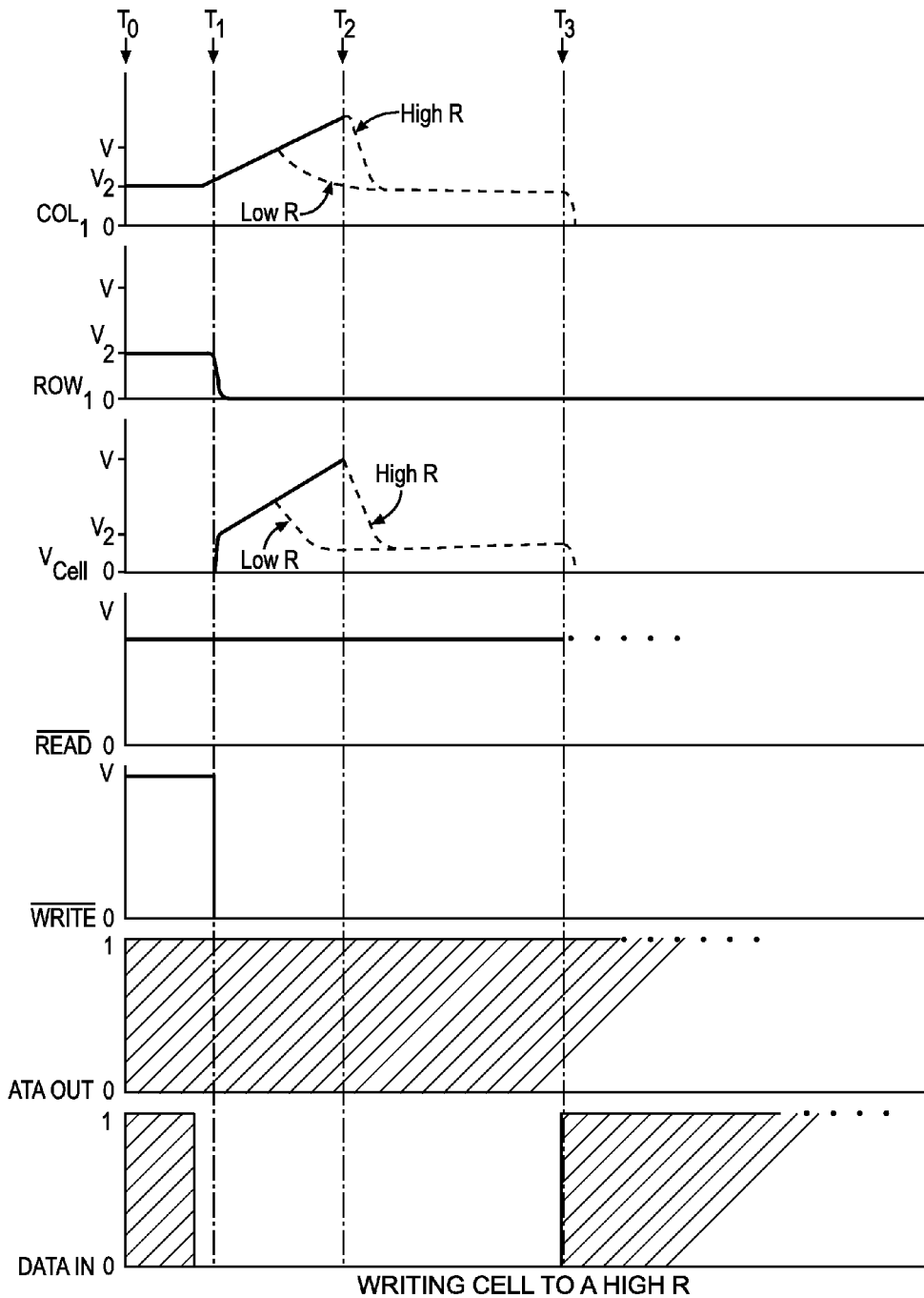

The timing diagram of FIG. 5D depicts the sequence of a write "0" (high resistance) "RESET" operation in accordance with the principles of the present invention. In this illustrative embodiment, programming a memory cell to a high resistance state (that is, writing a logic "0" into the memory), is accomplished by forcing a current through the memory cell of sufficient magnitude to melt an active volume of phase change material, then rapidly remove the current in order to quickly cool the material in its high-resistance, amorphous, state. As is known in the art, quench transistors may be employed to accelerate the termination of the programming current and to thereby more-effectively trap an active volume of the phase change material in the amorphized, high-resistance, state. As previously described, the pulse generation circuitry used to program a cell to a high-resistance state will typically employ enough current to take the OUM into the "dynamic on" current range described in the discussion relate to FIG. 4: typically, more current than employed in either a READ or a SET (write 1) operation.

A RESET operation is very much like a SET operation, the main distinction being the characteristics of the programming current pulse. While the current pulse employed in a SET operation is directed towards crystallizing an active volume of phase change material, the current pulse employed in a RESET operation is directed towards amorphizing an active volume of phase change material. A RESET current pulse must melt an active volume of phase change material, then rapidly freeze the material in the amorphous state; a SET current pulse need only elevate the temperature of an active volume of phase change material to a level that accelerates the crystallization of the material and hold the material at an elevated temperature until an active volume of the material is crystallized.

In operation, at time T0 both the row one select signal ROW1 and column one select signal COL1 are at the "precharge," or deselect, voltage V/2. As previously indicated, other deselect voltages may be employed in accordance with the principles of the present invention. In this illustrative example, the WRITE0 process (also referred to herein as a RESET process) is initiated at time T1 by driving the column line COL1 associated with the memory cell CELL 1,1 high (towards V+) and driving the row line ROW1 associated with the memory cell CELL 1,1 low (to 0V). In this illustrative embodiment the column line COL1 is charged to a positive voltage by a current pulse generated by asserting the WRITE0 signal at time T1.

As indicated in the trace labeled COL1, the column line of the selected memory cell CELL 1,1 begins to charge to a more positive voltage than V/2. At the same time, the row line, represented by the trace labeled ROW1 is rapidly discharged from V/2 to 0V. The memory cell voltage represented by the trace labeled Vcell is the difference between the column and row voltages.

If the OUM 120 is already in a low resistance state, the majority of the cell voltage Vcell will fall across the OTS 130. As a result, the OTS will trigger at a relatively lower cell voltage, as indicated by the broken-line traces labeled Low R in the COL1 and Vcell plots. If, on the other hand, the OUM 120 is in a high resistance state, the cell voltage Vcell will be distributed across the series combination of the OTS 130 and OUM 120 according to their relative resistances. The OTS 130 will then trigger at a higher cell voltage, as indicated by the broken-line traces labeled High R in the COL1 and Vcell traces.

In both cases, that is, where the OUM is SET or RESET, the OTS 130 is triggered and sufficient current is delivered to the OUM 120 to program it to the logic "0," high resistance, state after the OTS triggers.

Various programming methods may be employed by a memory in accordance with the principles of the present invention. For example, the current source used to access the OUM for a RESET operation may be just sufficient to raise an active volume of phase change material to the material's melting point or may be of sufficient magnitude to "overRESET" the material. Additionally, a RESET programming current pulse may vary in duration, but the trailing edge of the pulse is preferably fast enough (e.g. less than 10 nsec for $Ge_2Sb_2Te_5$ OUM alloy) to ensure that a substantial proportion of the phase change material that is amorphized remains in the amorphous state after withdrawal of the programming pulse.

The read and write functions described in general terms above may be adapted to different techniques, including those disclosed in issued patents and published patent applications previously incorporated by reference herein. In accordance with the principles of the present invention, at least a portion of the READ/WRITE circuitry associated with a phase change memory array is located "off-chip." That is, in accordance with the principles of the present invention, at least a portion of the READ/WRITE circuitry used to access the memory is located on a separate integrated circuit. The separate integrated circuit may be packaged with the memory or may be packaged separately and communicate with the memory through conventional means, such as a signal "bus" that may include digital and/or analog signal lines.

In an embodiment in which the dynamic resistance of a phase change memory device is measured, the resistance of the memory, and its corresponding storage value (a binary 000, 001, 010, . . . or 111, for example), is determined by measuring the voltage across the memory element as two different currents flow through the memory element, then dividing the voltage difference by the current difference. Additional voltage and current measurements may be made in order to improve accuracy and error correcting code (ECC) may be employed to further enhance the accuracy of such a memory, such ECC located on or off-chip.

In one embodiment, the resistance of the memory may be determined by (1) forcing a voltage across the memory; (2)

measuring the resulting current; and (3) dividing the forced voltage by the resulting current to compute resistance. In a related embodiment, the resistance of the memory may be determined by (1) forcing a first voltage across the memory; (2) measuring the current across the memory resulting from the first voltage; (3) forcing a second voltage across the memory; (4) measuring the current across the memory resulting from the second voltage; and (5) dividing the difference between the two forced voltages by the difference in the two resulting currents to compute resistance. The method may be extended to the application of more than two voltages and measurements of more than two resulting currents and computing resistance by either of the two foregoing approaches using multiple voltage-current data points or multiple voltage difference-current difference data points to obtain a series of resistance values that may be averaged or otherwise statistically analyzed to determine the resistance of the memory.

Proper selection of the applied voltages is needed to promote the accuracy of the resistance measurement and to avoid inadvertent programming of the memory. As noted in FIG. 2 hereinabove, the memory cell is in series with an isolation device between two address lines in a typical memory array. In order to read the memory cell, it is necessary to access the memory cell by transforming the isolation device to a conductive state by applying a suitable voltage. If the isolation device is a threshold switching device or a transistor, application of a voltage at or above a threshold voltage transforms the isolation device to a conductive state. If the isolation device is a diode, a voltage sufficient to forward bias the diode renders the diode conductive.

Although a minimum voltage is necessary to access the memory cell, it is important to prevent inadvertent programming of the memory cell. If the voltage between the address (row, column) lines of the selected memory cell is fixed and the isolation device transforms from a resistive state to a conductive state, the voltage across the selected memory cell increases. If the voltage across the memory cell becomes too high, the state of the memory cell may be altered and the memory cell may be programmed inadvertently during the read operation. When measuring (reading) resistance with a technique that employs the application of a fixed voltage, it is therefore necessary to insure that the fixed voltage is high enough to insure that the isolation device becomes conductive to permit access to the memory cell, but not so high that inadvertent programming of the memory cell occurs.

Figure 5E:
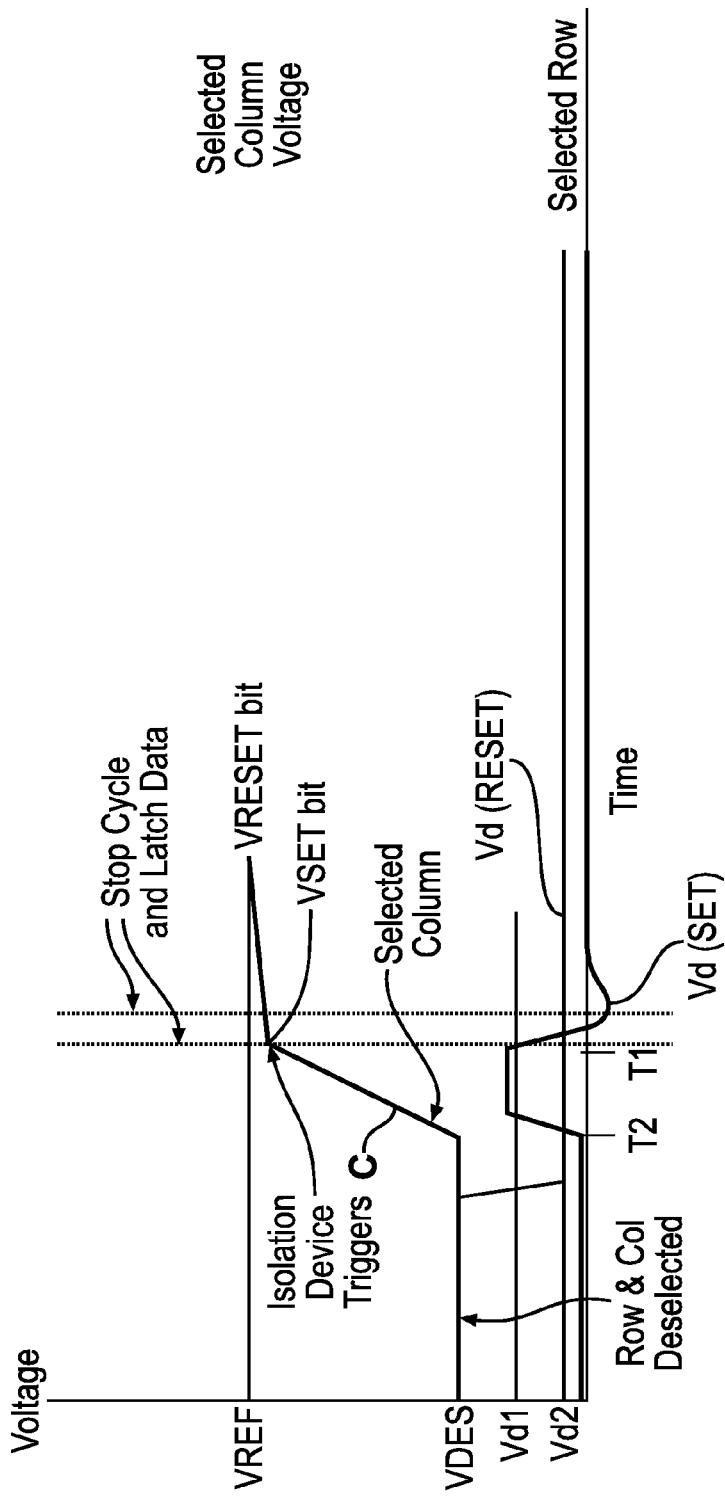

FIG. 5E depicts a timing diagram of a procedure that can be used to identify suitable voltages for determining the resistance of a memory cell. The diagram is directed to an embodiment in which the isolation device is a threshold switching device, but it is to be understood that the procedure can be readily adapted to the use of diodes or transistors as isolation devices. The procedure diagrammed in FIG. 5E is designed to permit detection of the threshold voltage of a threshold switching device. As noted hereinabove, the threshold voltage is the minimum voltage needed for access to the memory cell during a read operation. The range of suitable voltages that can be applied in a determination of the resistance of the memory cell extends from the threshold voltage to a voltage just below the voltage that initiates programming of the memory cell. One or more voltages for use in determining the resistance of the memory cell may be selected from among a series of voltages beginning with the threshold voltage and including additional voltages that are incremented from the threshold voltage by a fixed interval. By way of illustration, the voltage increment may be $\Delta V$ and the series of voltages may include $V_{th}$, $V_{th}+\Delta V$, $V_{th}+2\Delta V$, $V_{th}+3\Delta V$, . . . By way of illustration, $\Delta V$ may be 0.1V. With this procedure, the voltages used for determining the resistance of the memory cell are indexed to the threshold voltage and it is assured that a voltage sufficient to trigger the isolation device without inadvertently programming the memory is applied.

FIG. 5E shows a voltage profile for a memory cell in accordance with this embodiment. In the unselected state, the row and column lines of the memory cell are deselected and held at the deselect voltage VDES. Access of the cell occurs by driving the row line of the selected cell to a voltage below VDES and driving the column line of the selected cell to a voltage above VDES. The column line is driven high at time T2 and the row line is driven low at or before time T2. Upon selection of the row and column lines, a current pulse is applied at time Tstart (which may coincide with time T2) to read the resistance of the selected cell. The read current capacitively charges the column line and causes the column line voltage to increase.

Initially, the threshold switch isolation device is in its high resistance state and the resistance between the selected column line and selected row line is dominated by the resistance of the isolation device. As a result, most of the voltage difference between the selected column line and selected row line drops across the isolation device. As charging occurs, a continuous increase in the voltage of the column is observed. The rise of the column line voltage is depicted as C in FIG. 5E. When the voltage drop across the isolation device reaches the threshold voltage (at time T1), the isolation device switches to its conductive state. When the isolation device becomes conductive, the selected memory cell is accessed by the read current and the voltage across the selected memory cell increases. Since the resistance between the selected row and column lines changes when the isolation device becomes conductive, the rate of charging of the column line also changes. The change in the charging rate of the column line is detected as a discontinuity or slope change in the voltage profile of FIG. 5E. The point of change of the charging rate occurs at time T1 and is shown in FIG. 5E as the point at which the isolation device triggers. The read current pulse may be terminated at the time that the isolation device triggers.

The rate of charging of the selected column line after the isolation device triggers is controlled by the state of the memory device. FIG. 5E shows the typical variation in the voltage of the selected column line after the isolation device triggers for a memory cell in the set and reset states. The time variation of the selected column line voltage depends on the resistance of the pathway between the selected column line and the selected row line. When the isolation device transforms to its conductive state, the resistance is controlled by a combination of line resistance and memory cell resistance. When the memory cell is in its high resistance reset state, the change in resistance when the isolation device triggers is less than when the memory cell is in its low resistance set state. The discontinuity or change in slope of the selected column line upon triggering the isolation device is accordingly less pronounced when the memory cell is in its reset state than when the memory cell is in its set state.

Irrespective of the state of the memory cell, the discontinuity or slope change in the rate of charging of the column line (or time variation in column line voltage) marks the beginning of a voltage regime in which the isolation device is conductive and the memory cell can be accessed for a read operation. The discontinuity or slope change in the rate of charging of the column may accordingly serves as a signal for the triggering of the isolation device and marks the lower limit of a suitable range of voltages that can be used to read the memory cell. The upper limit of the range is the lowest voltage at which a change in the state of the memory cell is detected. The change in state is typically detected as a change in resistance. To provide adequate margin, the practical upper voltage limit (VREF in FIG. 5E) is set 10% or more below the lowest voltage at which the state of the memory cell is altered.

The discontinuity or change in slope of the voltage of the selected column line can be detected as a voltage derivative using a standard differentiator circuit known to those in the art that includes a capacitor and resistor. An illustrative circuit for detecting a discontinuity or change in the slope of address line voltage for a phase-change memory is described in U.S. Pat. No. 7,495,944, the disclosure of which is hereby incorporated by reference herein. (See in particular FIG. 3 of U.S. Pate. No. 7,495,944, which includes differentiator element 535.) The differentiator provides an output that reflects changes in the rate of charging of a selected address line. Changes in the rate of charging may be referred to herein as voltage derivatives. FIG. 5E includes traces Vd (RESET) and Vd (SET) that show the voltage derivative of the selected column line for memory cells in the reset and set states, respectively.

Before the selected column line is driven high, its voltage (VDES) is constant and invariant with time. When the column line is selected at time T2, the column line voltage increases discontinuously and the voltage derivative becomes positive. In interval C shown in FIG. 5E, the voltage of the selected column increases at a constant rate and the voltage derivative is constant. Before the isolation device triggers, the voltage derivative response is largely independent of the state of the memory cell. When the isolation device triggers to its conductive state, the voltage derivative response differs for memory cells in the set and reset states as shown in FIG. 5E. The difference in voltage derivative response for the two states reflects the difference in the voltage response described hereinabove for the set and reset states. Because the combined resistance of the isolation device and memory cell decreases regardless of the state of the memory cell when the isolation device triggers, the rate of charging of the column line decreases. As a result, the voltage derivative of both the set and reset states of the memory cell shows a discontinuous decrease when the isolation device triggers. Since the resistance of the reset state is higher than the resistance of the set state, a larger decrease in voltage derivative occurs for the set state than for the reset state.

As shown in FIG. 5E, the voltage derivative of the selected column line may become negative when the memory cell is in the set state at the time the isolation device triggers. Monitoring the voltage derivative with a differentiator permits detection of the voltage at which the isolation device triggers. In a further embodiment, the procedure may include a comparison of a measured rate of charging or voltage derivative with one or more reference rates of charging or voltage derivatives. Vd1 and Vd2 in FIG. 5E are illustrative reference voltage derivatives. As indicated hereinabove, the rate of change of charging upon triggering of the isolation device is an indicator of the state of the memory cell. The time required for the voltage derivative of the selected column line to fall below a reference voltage derivative may accordingly be used to detect the state of the memory cell. A short time signifies that the memory cell is in the set state, while a long time signifies that the memory cell is in the reset state. In FIG. 5E, for example, the voltage derivative when the memory cell is in the set state decreases below reference voltage Vd1 sooner than when the memory cell is in the reset state.

The state of the memory cell may also be detected according to whether the voltage derivative of the selected column line falls below a particular reference voltage derivative. In FIG. 5E, for example, the voltage derivative of the selected column line decreases below reference voltage Vd2 when the memory cell is in the set state, but not when the memory cell is in the reset state. Alternatively, a fixed time window may be defined and the state of the memory cell may be determined by comparing the voltage derivative of the selected column line to a reference voltage derivative at the conclusion of the time window. The reference voltage derivative is selected as a voltage derivative between the expected voltage derivatives for set and reset states based on the typical resistances of the set and reset states. When the time window ends, the voltage derivative may be latched and detected.

This embodiment of the instant invention accordingly provides a method for identifying a range of voltages that may be used in the reading of memory cells that is indexed to the voltage required to transform the isolation device to a conductive state. Voltages within the range are sufficient to insure that the isolation device is triggered to its conductive state so that it does not interfere with or detract from the accuracy of the resistance measured for the memory cell. At the same time, voltages within the range are too low to cause inadvertent programming of the selected memory cell. Voltages within the range can be used in a procedure for determining the resistance of the selected memory cell. The procedure applies one or more fixed voltages between the address lines of the selected memory cell and measures the current resulting from each voltage. A measure of the resistance of the memory cell can be computed by dividing a particular applied voltage ($V_1$) by the particular current ($I_1$) resulting from the applied voltage. The resistance determined by this procedure may be referred to herein as a fixed resistance. Alternatively, the resistance may be assessed by dividing the difference between two fixed voltages ($V_2-V_1$) by the difference in current ($I_2-I_1$) resulting from the two fixed voltages. The resistance determined by this procedure may be referred to herein as a dynamic or differential resistance. Multiple fixed or dynamic resistances may also be determined and statistically compared or analyzed to compute the resistance of the selected memory cell.

Referring back to FIG. 2, portions of the Read and Write circuits may be located off chip, with 1 or more lines selected by the Bit line Selector. For example, 8 lines, 1 per tile, may be selected from different tiles within the chip. These lines, passing through p-channel devices controlled by the decoder provide analog information about the memory cell. In an illustrative embodiment, such information is provided by forcing a voltage and measuring a current. Or forcing 2 voltages and measuring 2 currents, so that the dynamic resistance may be measured more accurately—thereby providing more accurate information about a particular bit. Such information may be used to both read and write more accurately. And such write may be to specific level, helpful to do MLC on chip. And by adding ECC bits for a page or sector, reading bits may be combined with analog information read, both before and after write, to correct bits in the sector or page.

Figure 6:
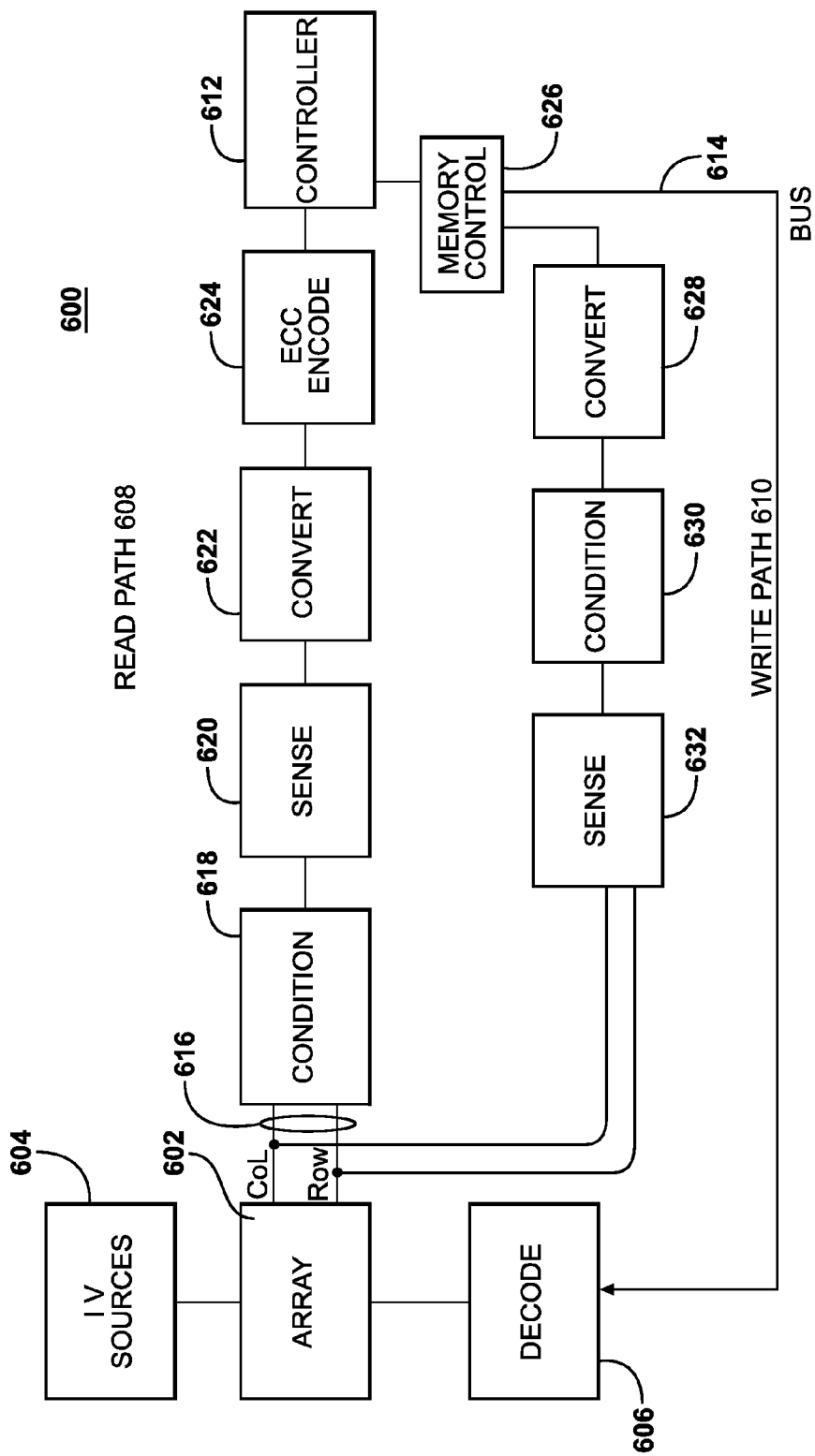
FIG. 6 is a block diagram of a programmable resistance memory and memory controller in accordance with the principles of the present invention.

The block diagram of FIG. 6 provides an overview of a phase change memory and support circuitry in accordance with the principles of the present invention. As previously a phase change memory in accordance with the principles of the present invention may employ circuitry that shares the same physical integrated circuit as the memory array itself or that may be implemented, in whole or in part, on a separate integrated circuit. The various functions may be implemented in analog or digital circuitry or combinations thereof and may also include firmware, software, microcode or other hardware or software such as is known in the art. Analog information generated through the bit line selector (1 or more lines) may be converted by A/D to digital information for processing.

Similarly digital information may be used, by D/A conversion, to analog information (currents) for writing through to the bit lines selected by the Bit Line Selector 215 in FIG. 2.

The memory system 600 in FIG. 6 includes a memory array 602, such as the memory array 100 of memory elements and isolation devices as described in the discussions related to FIG. 1. A source block 604 includes current and/or voltage sources that are switched into selected column and row lines by a decoding block 606. The decoding block 606 accepts row and column addresses and decodes them to determine which of the cells within the crosspoint array will be accessed. Additionally, the decoding block accepts access signals, such as READ, WRITE0, WRITE1, WRITE2, . . . WRITEn and decodes these signals to determine which of the voltage and/or current sources from the source block 604 to apply to selected rows and columns. That is, as previously noted, a READ access may employ a current pulse source having substantially different characteristics from a current pulse source used for a WRITE0 (that is, a RESET), for a WRITE1 (a SET), or WRITEn (an intermediate value, between SET and RESET), and the decode block 606 determines which of the sources to use, based upon the value of access signals such as READ, WRITE0, etc. In an illustrative embodiment, the decode block also decodes the value of data lines to determine which of the WRITE sources, WRITE0, WRITE1, etc., to employ for a write operation.

A write path 610 and a read path 608 connect the array 602 to a memory controller 612. In accordance with the principles of the present invention, portions of the READ 608 and WRITE 610 paths may be co-located on the same integrated circuit (also referred to herein as a "chip") as the memory controller 612, or for larger memories on the memory chip (along with the controller). A bus 614 includes address, data, and control lines. The control lines include directional control lines READ and WRITE, and other control lines such as are known in the art. Memory array cell lines 616 provide direct access to data nodes within the memory array 602. In an illustrative embodiment, the cell lines 616 are coupled to row and column lines within the array 602, thereby providing direct access to the points within the array at which the contents of the array may be determined. Signal conditioning circuitry 618 within the READ path 608 may include circuitry, such as buffers for example, used to preserve the integrity of signals associated with the memory cells within the array 602. Conditioned signals from the conditioning circuitry 618 are coupled to sensing circuitry 620. The sensing circuitry 620 includes circuitry configured to determine the state of an accessed memory cell, including cells that have been programmed according to a multilevel programming scheme. To that end, the sensing circuitry 620 may include circuitry that directly or indirectly senses the resistance of an accessed memory cell or that directly or indirectly senses the threshold voltage of an accessed memory cell. For example, the resistance of an accessed cell may be determined by applying a known, precision, voltage across an accessed cell and determining the resultant current that flows through the cell, or by supplying a known, precision, current through the cell and determining the resultant voltage. Such measurements may be converted on or off chip by A/D circuitry, for further processing and ECC.

Voltage and current differences may also be employed to determine the resistance of an accessed cell, by applying known voltages to a cell, measuring the resultant currents, and dividing the difference in voltage by the difference in current to obtain the dynamic resistance of the cell. As is known in the art, the accuracy of such measurements are greatly enhanced by making the measurements while the accessed cell is in the dynamic on state, after an associated isolation device, such as an OTS, has triggered. Additionally, a memory cell in accordance with the principles of the present invention may be read by determining the threshold voltage of a phase change element within an accessed cell. Various forms of feedback may be employed in the process of reading a memory cell in accordance with the principles of the present invention, to adjust READ voltage- or current-sources, for example.

Conversion circuitry 622 may perform analog to digital conversion and may, in fact, be inextricably linked to the sensing circuitry. That is, sensing circuitry 620 may include one or more comparators that compare the signal generated by forcing a known current through or voltage across an accessed cell. In such an embodiment, the comparators don't actually sense the value of the generated signal, they convert the analog value of the generated signal to a digital value, the precision of which may be determined, for example, by the number of comparators and references used. A digitized signal produced by the converting circuitry 622 may be operated upon by error detection and correction circuitry 624 in order to improve the accuracy of a memory access operation. Error detection and correction circuitry is known in the art and discussed, for example in published United States Patent Application 20060059405 entitled, USING A PHASE CHANGE MEMORY AS A HIGH VOLUME MEMORY, to having Ward Parkinson as inventor, which is hereby incorporated by reference.

Figure 7:
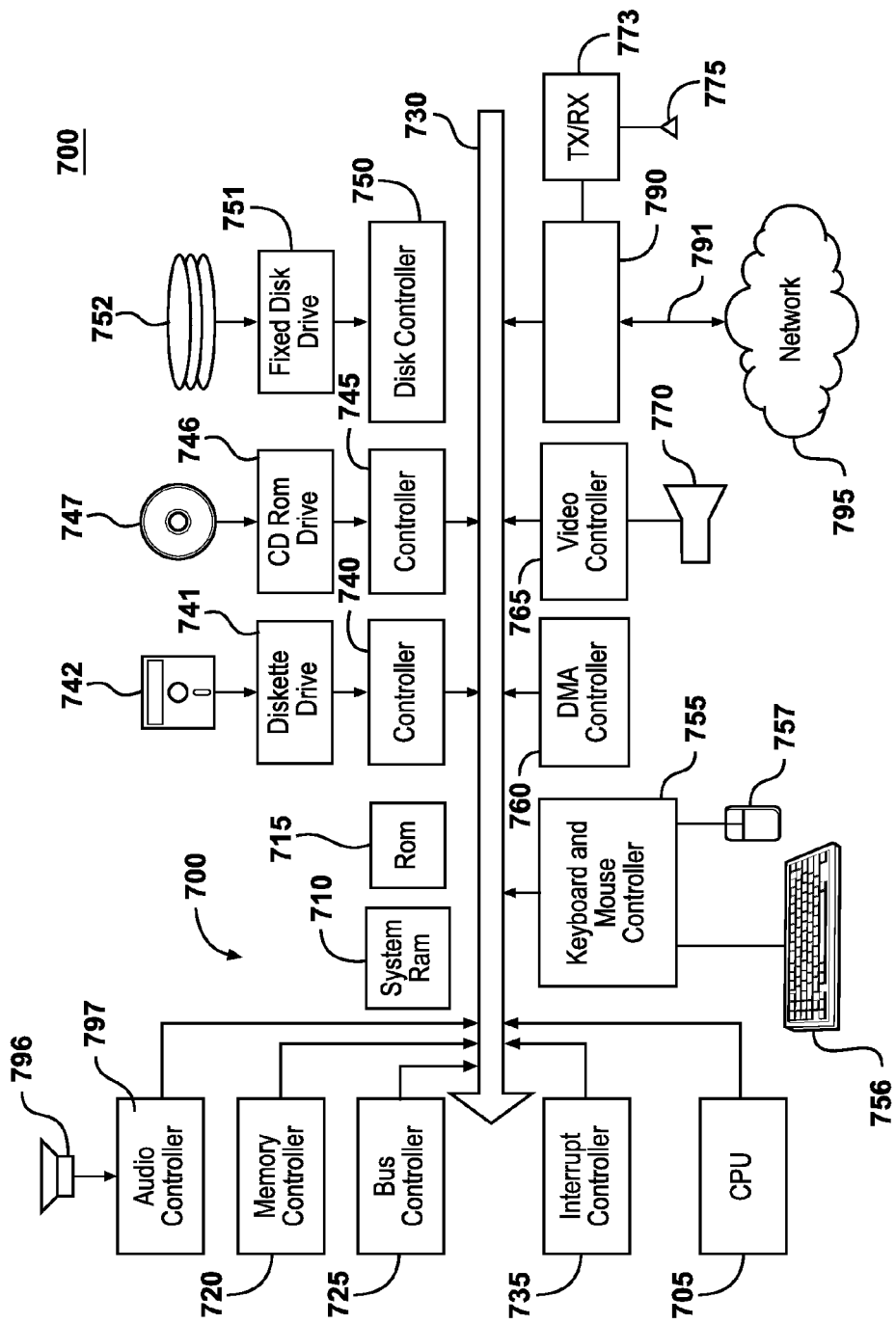
FIG. 7 is a block diagram of an electronic system that employs a memory in accordance with the principles of the present invention.

Memory controller circuitry 612 provides higher-level memory-access functionality and may, for example, include circuitry, firmware, and/or microcode that provide a multi-level interface between one or more memory arrays 602 and external circuitry, such as a microprocessor or other controller within a system, such as described in greater detail in the discussion related to FIG. 7. The multi-layered interface functions of such a controller 612 may include block reads, for example, at a "higher level," as well as interface functions for the "system bus side" of a memory subsystem. On the "memory array side," the controller 612 may provide lower-level signal flow signals, such as READ, WRITE or chip enable, for example, or such operations may be assigned to memory control circuitry 626 positioned in the memory write path 614. Additionally, for WRITE operations, the type of write to be performed, e.g., a SET, a RESET, or an intermediate value, may be signaled by the memory control circuitry 626. Such operations may be controlled for the memory by the Memory Controller.

Much as converter circuitry 622 converts analog signals from the memory array into digital form, if not converted on the memory, for use by the memory controller 612, converter circuitry 628 converts digital signals from the memory controller 612 into analog form for use by the memory array 602. This conversion process may involve the conversion from a digital value to a precision current or voltage, may include feedback to adjust programming current or voltage levels and may entail an iterative process whereby a memory cell is written to, then read, the write sources (current or voltage pulse source, for example) adjusted as necessary, and the process repeated until the value written into the memory cell is within a target range.

Conditioning circuitry 630 may, for example, buffer the analog signal used to write to a cell within the memory array 602. Sensing circuitry 632 may be employed in a feedback embodiment in which programming signals are adjusted to provide accurate programming results. In an illustrative embodiment the sensing circuitry 632 may, in fact, be the same circuitry as the sensing circuitry 620 employed in the READ path. That is, a write may be achieved by writing a bit, reading it (or converting analog to digital for further processing, adjusting the write pulse and writing again.

In accordance with the principles of the present invention a portion of the circuitry within the READ path 608 or WRITE path 610 may be located on an integrated circuit other than the integrated circuit that houses the memory array 602. In an illustrative embodiment the contents of cells within the array 602 are determined by measuring computing the dynamic resistance of an accessed cell and that computation is carried out by the controller 612. In this illustrative embodiment, to determine the contents of a memory cell a precision read current is supplied to the cell and the cell is monitored to detect the time at which the cell's isolation device is triggered. Once the isolation device has triggered, a precision voltage compliant source is applied to the cell and the corresponding current through the cell measured. Subsequently, a different precision voltage-compliant source is applied to the accessed cell and the corresponding current measured. The resistance of the accessed devices is then computed by dividing the difference in voltage by the corresponding difference in current. Such a division operation is carried out, in this illustrative embodiment, by circuitry located on a different integrated circuit than that of the memory array 602, which integrated circuit may be the memory controller 612. In different illustrative embodiments, the signal conditioning 618, sensing 620, converting 622, error detection and correction 624, control 626, conversion 628, conditioning 630, and sensing 632 circuitry may all be located on the memory controller integrated circuit 612, with the raw column and row voltages from the array brought off the array 602 and supplied to the controller 612, for example.

The electronic device(s) described in the discussion related to the previous figures may be employed to particular advantage in a wide variety of systems. The schematic diagram of FIG. 7 will be discussed to illustrate the devices' use in a few such systems. The schematic diagram of FIG. 7 includes many components and devices, some of which may be used for specific embodiments of a system in accordance with the principles of the present invention and others not used. In other embodiments, other similar systems, components and devices may be employed. In general, the system includes logic circuitry configured to operate along with phase change memory devices in accordance with the principles of the present invention. The logic circuitry may be discrete, programmable, application-specific, or in the form of a microprocessor, microcontroller, or digital signal processor, for example. The embodiments herein may be employed on integrated chips or connected to such circuitry. The exemplary system of FIG. 7 is for descriptive purposes only.

Although the description may refer to terms commonly used in describing particular computer, communications, tracking, and entertainment systems; the description and concepts equally apply to other systems, including systems having architectures dissimilar to that illustrated in FIG. 7. The electronic system 700, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 7 may employ phase change memory devices in accordance with the principles of the present invention, for example.

In an illustrative embodiment, the system 700 may include a central processing unit (CPU) 705, which may include a microprocessor, a random access memory (RAM) 710 for temporary storage of information, and a read only memory (ROM) 715 for permanent storage of information. A memory controller 720 is provided for controlling RAM 710. In accordance with the principles of the present invention, all of, or any portion of, any of the memory elements (e.g. RAM or ROM) may be implemented with phase change memory devices in accordance with the principles of the present invention.

An electronic system 700 in accordance with the principles of the present invention may be a microprocessor that operates as a CPU 705, in combination with embedded high ratio of dynamic range to drift coefficient phase change memory devices that operates as RAM 710 and/or ROM 715, or as a portion thereof. In this illustrative example, the microprocessor/high ratio of dynamic range to drift coefficient phase change memory devices combination may be standalone, or may operate with other components, such as those of FIG. 7 yet-to-be described.

In implementations within the scope of the invention, a bus 730 interconnects the components of the system 700. A bus controller 725 is provided for controlling bus 730. An interrupt controller 735 may or may not be used for receiving and processing various interrupt signals from the system components. Such components as the bus 730, bus controller 725, and interrupt controller 735 may be employed in a large-scale implementation of a system in accordance with the principles of the present invention, such as that of a standalone computer, a router, a portable computer, or a data storage system, for example.

Mass storage may be provided by diskette 742, CD ROM 747, or hard drive 752. Data and software may be exchanged with the system 700 via removable media such as diskette 742 and CD ROM 747. Diskette 742 is insertable into diskette drive 741 which is, in turn, connected to bus 730 by a controller 740. Similarly, CD ROM 747 is insertable into CD ROM drive 746 which is, in turn, connected to bus 730 by controller 745. Hard disc 752 is part of a fixed disc drive 751 which is connected to bus 730 by controller 750. Although conventional terms for storage devices (e.g., diskette) are being employed in this description of a system in accordance with the principles of the present invention, any or all of the storage devices may be implemented using phase change memory devices in accordance with the principles of the present invention. Removable storage may be provided by a nonvolatile storage component, such as a thumb drive, that employs phase change memory devices in accordance with the principles of the present invention as the storage medium. Storage systems that employ phase change memory devices as "plug and play" substitutes for conventional removable memory, such as disks or CD ROMs or thumb drives, for example, may emulate existing controllers to provide a transparent interface for controllers such as controllers 740, 745, and 750, for example.

User input to the system 700 may be provided by any of a number of devices. For example, a keyboard 756 and mouse 757 are connected to bus 730 by controller 755. An audio transducer 796, which may act as both a microphone and/or a speaker, is connected to bus 730 by audio controller 797, as illustrated. Other input devices, such as a pen and/or tabloid may be connected to bus 730 and an appropriate controller and software, as required, for use as input devices. DMA controller 760 is provided for performing direct memory access to RAM 710, which, as previously described, may be implemented in whole or part using phase change memory devices in accordance with the principles of the present invention. A visual display is generated by video controller 765 which controls display 770. The display 770 may be of any size or technology appropriate for a given application.

In a cellular telephone or portable entertainment system embodiment, for example, the display 770 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 700 may also include a communications adaptor 790 which allows the system to be interconnected to a local area network (LAN) or a wide area network (WAN), schematically illustrated by bus 791 and network 795. An input interface 799 (not shown) operates in conjunction with an input device 793 (not shown) to permit a user to send information, whether command and control, data, or other types of information, to the system 700. The input device and interface may be any of a number of common interface devices, such as a joystick, a touch-pad, a touch-screen, a speech-recognition device, or other known input device. In some embodiments of a system in accordance with the principles of the present invention, the adapter 790 may operate with transceiver 773 and antenna 775 to provide wireless communications, for example, in cellular telephone, RFID, and wifi computer implementations.

Operation of system 700 is generally controlled and coordinated by operating system software. The operating system controls allocation of system resources and performs tasks such as processing scheduling, memory management, networking, and I/O services, among other things. In particular, an operating system resident in system memory and running on CPU 705 coordinates the operation of the other elements of the system 700.

In illustrative handheld electronic device embodiments of a system 700 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 755, keyboard 756 and mouse 757, for example. Embodiments with a transmitter, recording capability, etc., may also include a microphone input (not shown).

In an illustrative RFID transponder implementation of a system 700 in accordance with the principles of the present invention, the antenna 775 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 773, where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a phase change memory devices in accordance with the principles of the present invention. In this illustrative embodiment, data read out from the memory is transferred to the transceiver 773 as an "answerback" signal on the antenna 775 at a second carrier frequency $F_2$. In passive RFID systems, power is derived from the interrogating signal and memory such as provided by a phase change memory device in accordance with the principles of the present invention is particularly well suited to such use.

I claim:

1. A method of operating an electronic device comprising:
   providing a first conductive line;
   providing a second conductive line;
   coupling an access device and a programmable resistance device in series between said first conductive line and said second conductive line;
   applying a first electrical pulse to said first conductive line, said first electrical pulse increasing the magnitude of the voltage of said first conductive line;
   monitoring the voltage of said first conductive line;
   detecting a decrease in the magnitude of the voltage of said first conductive line, said decrease occurring at a first time;
   detecting the voltage of said first conductive line at said first time;
   terminating said first electrical pulse; and
   applying a second electrical pulse to said first conductive line, said second electrical pulse forcing a first voltage on said first conductive line, said first voltage having a magnitude greater than or equal to the magnitude of said voltage detected at said first time.

2. The method of claim 1, wherein said access device is a threshold switching device.

3. The method of claim 1, wherein said access device is a diode.

4. The method of claim 1, wherein said programmable resistance device is a memory device.

5. The method of claim 4, wherein said memory device is a phase-change device.

6. The method of claim 1, wherein said monitoring voltage comprises directing a current from said first conductive line to a capacitor.

7. The method of claim 6, further comprising comparing the rate of change of said voltage of said first conductive line to a first reference rate of voltage change.

8. The method of claim 7, further comprising comparing the rate of change of said voltage of said first conductive line to a second reference rate of voltage change.

9. The method of claim 1, wherein said decrease in the magnitude of said voltage of said first conductive line is detected as a decrease in the rate of charging of said first conductive line.

10. The method of claim 9, wherein said decrease in the rate of charging of said first conductive line is discontinuous.

11. The method of claim 1, wherein said first electrical pulse causes said access device to transform from a resistive state to a conductive state.

12. The method of claim 9, wherein said transformation occurs at said first time.

13. The method of claim 1, wherein said decrease in said magnitude of said voltage of said first conductive line is discontinuous.

14. The method of claim 1, wherein said terminating said first electrical pulse includes directing current from said first electrical pulse to a quench transistor.

15. The method of claim 1, further comprising measuring the current passing between said first conductive line and said second conductive line.

16. The method of claim 15, wherein the current is the current produced by said first voltage.

17. The method of claim 16, further comprising computing the ratio of said first voltage to said current produced by said first voltage.

18. The method of claim 1, further comprising applying a third electrical pulse to said first conductive line, said third electrical pulse forcing a second voltage on said first conductive line, said second voltage differing from said first voltage and having a magnitude greater than or equal to the magnitude of said voltage detected at said first time.

19. The method of claim 18, wherein said first voltage causes a first current to pass between said first conductive line and said second conductive line and said second voltage causes a second current to pass between said first conductive line and said second conductive line and wherein said method further comprises determining the difference between said first current and said second current.

20. The method of claim 19, further comprising determining the difference between said first voltage and said second voltage.

21. The method of claim 20, further comprising determining the ratio of said difference between said first voltage and said second voltage to said difference between said first current and said second current.

22. The method of claim 1, further comprising terminating said first electrical pulse if said magnitude of said voltage of said first conductive line reaches a pre-determined voltage.

23. The method of claim 22, wherein said pre-determined voltage is a voltage sufficient to induce a change in the resistance of said programmable resistance device.

24. The method of claim 1, wherein said first voltage is insufficient to alter the state of said programmable resistance device.

25. A method of operating an electronic device comprising:
providing a first conductive line;
providing a second conductive line;
coupling an access device and a programmable resistance device in series between said first conductive line and said second conductive line, said access device having a threshold voltage, said access device switching from a resistive state to a conductive state upon application of said threshold voltage; and
detecting the state of said programmable resistance device with an electrical pulse, said electrical pulse producing a voltage across said access device, said voltage being insufficient to switch said access device from said resistive state to said conductive state.

* * * * *